(12) United States Patent
Lee

(10) Patent No.: US 12,733,510 B2
(45) Date of Patent: Sep. 8, 2026

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Joon Seuk Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 359 days.

(21) Appl. No.: 18/319,349

(22) Filed: May 17, 2023

(65) Prior Publication Data

US 2024/0222289 A1 Jul. 4, 2024

(30) Foreign Application Priority Data

Dec. 28, 2022 (KR) ........................ 10-2022-0186708

(51) Int. Cl.

*H10W 46/00* (2026.01)
*H10B 41/27* (2023.01)
*H10B 43/27* (2023.01)

(52) U.S. Cl.

CPC ............ *H10W 46/00* (2026.01); *H10B 41/27* (2023.02); *H10B 43/27* (2023.02); *H10W 46/301* (2026.01)

(58) Field of Classification Search

CPC ........ H10B 41/27; H10B 43/27; H10B 43/40; H10B 43/50; H01L 2223/5442; H01L 2223/54426; H01L 2223/54453; H01L 2223/5446; H01L 23/544

See application file for complete search history.

(56) References Cited

U.S. PATENT DOCUMENTS 7,550,379 B2 6/2009 Haren et al.
9,691,782 B1 * 6/2017 Hwang .................. H10B 43/40
9,748,257 B2 * 8/2017 Lee ........................ H10B 43/50
2016/0322381 A1 * 11/2016 Liu ........................ H10B 43/27
2017/0062455 A1 * 3/2017 Nomura ................. H10B 43/27
2021/0028058 A1 * 1/2021 Kim ....................... H10B 43/40
2022/0199626 A1 * 6/2022 Chung ................. H10B 12/395
2023/0411207 A1 * 12/2023 Kim ....................... H10B 43/27
2024/0138141 A1 * 4/2024 Chung ................. H10B 12/395
2026/0071261 A1 * 3/2026 Roy ..................... C12Q 1/6827

FOREIGN PATENT DOCUMENTS

KR 1020100044031 A 4/2010
KR 20100129544 A * 12/2010 ............ H10W 46/00
KR 1020170099209 A 8/2017
KR 20210012772 A * 2/2021 .......... H10W 20/056
KR 1020210012772 A 2/2021
KR 1020220090211 A 6/2022

* cited by examiner

*Primary Examiner* — Edward Chin
(74) *Attorney, Agent, or Firm* — WILLIAM PARK AND ASSOCIATES LTD.

(57) ABSTRACT

A semiconductor device may include a substrate including chip areas and a scribe lane area that is disposed between the chip areas, a first stack disposed in the scribe lane area and including first material layers and second material layers that are alternately stacked, and alignment keys disposed within the first stack including first protrusion parts that protrude from an upper surface of the first stack, respectively.

20 Claims, 29 Drawing Sheets

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. § 119(a) to Korean Patent Application No. 10-2022-0186708 filed on Dec. 28, 2022, in the Korean Intellectual Property Office, which is incorporated herein by reference in its entirety.

BACKGROUND

1. Technical Field

Embodiments relate to an electronic device and a method of manufacturing the electronic device and, more particularly, to a semiconductor device and a method of manufacturing the semiconductor device.

2. Related Art

The degree of integration of semiconductor devices is basically determined by the area that is occupied by a unit memory cell. As the improvement of the degree of integration of semiconductor devices in which a memory cell is formed on a substrate as a single layer recently reaches its limit, a three-dimensional semiconductor device in which memory cells are stacked on a substrate is proposed. Furthermore, in order to improve operation reliability of such a semiconductor device, various structures and manufacturing methods are developed.

SUMMARY

A semiconductor device may include: a substrate including chip areas and a scribe lane area that is disposed between the chip areas, a first stack disposed in the scribe lane area and including first material layers and second material layers that are alternately stacked, and alignment keys disposed within the first stack and including first protrusion parts that protrude from an upper surface of the first stack, respectively.

A semiconductor device may include: a substrate including a chip area and an edge area that surrounds the chip area, a first stack disposed in the edge area and including first material layers and second material layers that are alternately stacked, at least one alignment key disposed within the first stack and including a first protrusion part that protrudes from an upper surface of the first stack, a gate structure disposed in the chip area and including conductive layers and insulating layers that are alternately stacked, and channel structures disposed within the gate structure and having a height substantially identical with a height of the alignment keys.

A method of manufacturing a semiconductor device may include forming a first stack including first material layers and second material layers that are alternately stacked, in a scribe lane area that is disposed between chip areas of a substrate, forming a first mask layer over the first stack, forming alignment keys within the first mask layer and the first stack, and etching the first mask layer so that the alignment keys protrude from an upper surface of the first stack.

A method of manufacturing a semiconductor device may include forming a first stack including first material layers and second material layers that are alternately stacked, forming, over the first stack, a second stack including third material layers and fourth material layers that are alternately stacked, forming a first mask layer over the second stack, forming alignment keys within the first mask layer and the second stack, etching the first mask layer so that the alignment keys protrude from an upper surface of the second stack, and forming a second mask layer over the second stack.

DETAILED DESCRIPTION

Hereinafter, embodiments according to the technical spirit of the present disclosure are described with reference to the accompanying drawings.

An embodiment of the present disclosure may provide a semiconductor device having a stable structure and improved characteristics and a method of manufacturing the semiconductor device.

According to this technology, the semiconductor device having a stable structure and improved reliability can be provided.

Figure 1A:
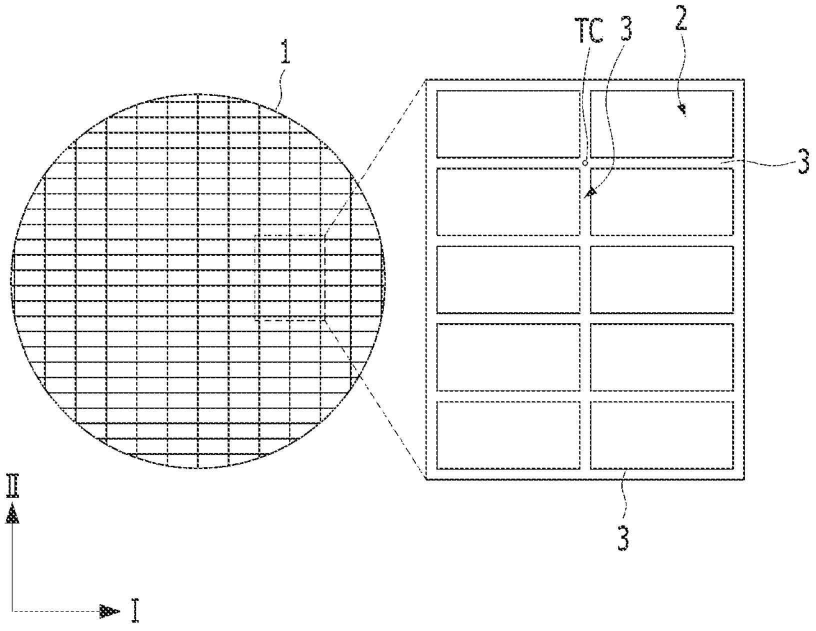
FIGS. 1A and 1B are diagrams illustrating a structure of a semiconductor device according to an embodiment of the present disclosure.
Figure 1B:
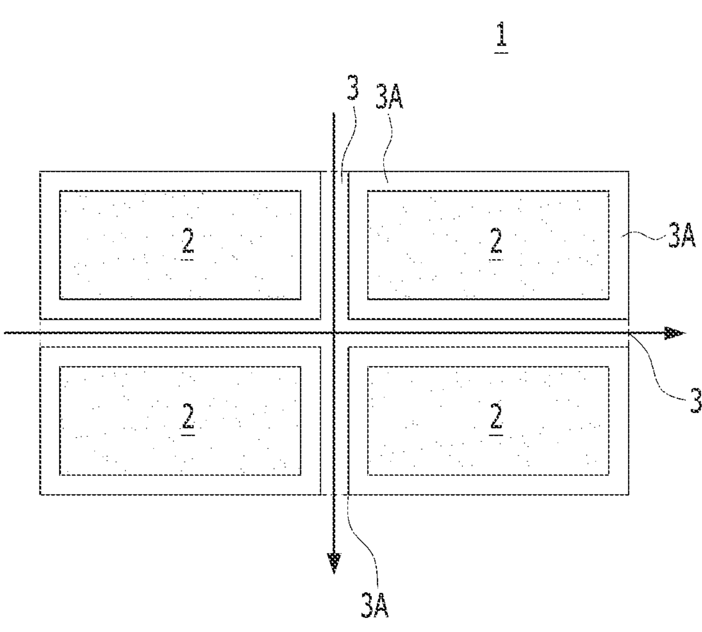

FIGS. 1A and 1B are diagrams illustrating a structure of a semiconductor device according to an embodiment of the present disclosure.

Referring to FIG. 1A, the semiconductor device may include a substrate 1. The substrate 1 may include chip areas 2 and a scribe lane area 3. For example, the substrate 1 may include the chip areas 2 and the scribe lane area 3, which is substrate material located between peripheral edges of the chip areas 2. The substrate 1 may be a semiconductor substrate, such as a silicon wafer, a SiGe wafer, or an SOI wafer.

The chip areas 2 may be areas in which semiconductor chips are formed. Several identical semiconductor chips may be repeatedly formed in the substrate 1. The chip areas 2 may be arranged in a first direction I and an orthogonal second direction II that intersects the first direction I. The scribe lane area 3 may be disposed between the chip areas 2.

Alignment keys to be used when the semiconductor chip that is disposed in the chip areas 2 is formed, may be disposed in the scribe lane area 3. For example, the alignment keys may be used to align or locate at least one of channel structures, a source contact structure, supports, contact plugs, and isolation insulating layers of the semiconductor chip. However, the present disclosure is not limited thereto, and the alignment keys may be used to align or locate various structures within the semiconductor chip. Test structures for testing the semiconductor chip may also be disposed in the scribe lane area 3.

The scribe lane area 3 may be a part of the substrate 1 that is cut off during a dicing process for separating the semiconductor chip areas 2 from the substrate 1. The chip areas 2 may be separated from each other by cutting the substrate 1 through the scribe lane area 3. The substrate 1 may be cut by using a method, such as a sawing process using a blade, a laser process using a laser, or a stealth dicing process.

FIG. 1B illustrates four, semiconductor dies, that remain after the substrate 1 is cut along the scribe lane area 3. Referring to FIGS. 1A and 1B, the substrate 1 may include chip areas 2 and an edge area 3A. For example, the substrate 1 may include the chip areas 2 and the edge area 3A that surrounds and abuts chip areas 2. The edge area 3A may be the portion of the scribe lane area 3 that remains after dicing the substrate 1. The alignment keys, not shown in FIG. 1B, which are used when the semiconductor chip is formed, may remain in the edge area 3A after dicing the substrate 1.

According to the aforementioned structure, the alignment keys may be disposed in the scribe lane area 3. The degree of integration of semiconductor chips can be improved by disposing the alignment keys in the scribe lane area 3 and not in the chip areas 2.

Figure 2A:
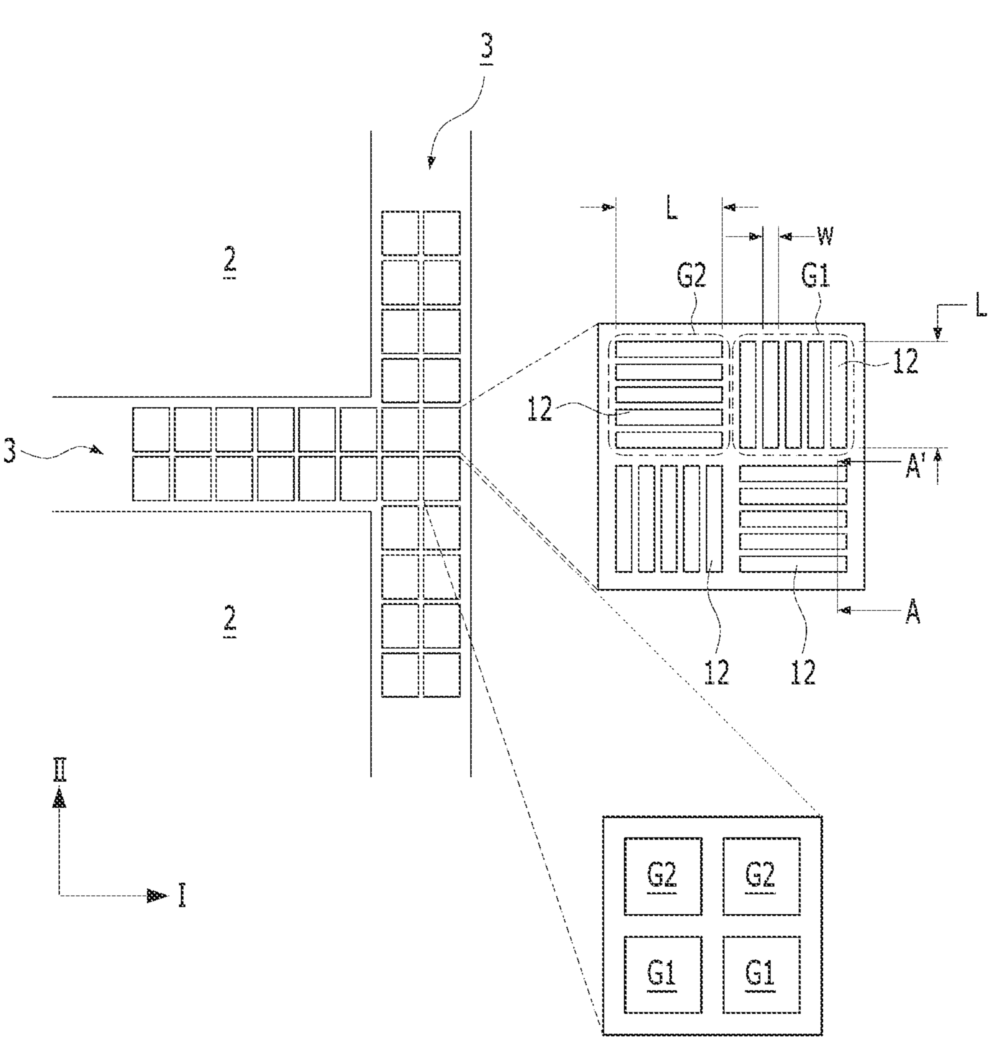
FIGS. 2A to 2D are diagrams illustrating a structure of a semiconductor device according to an embodiment of the present disclosure.
Figure 2B:
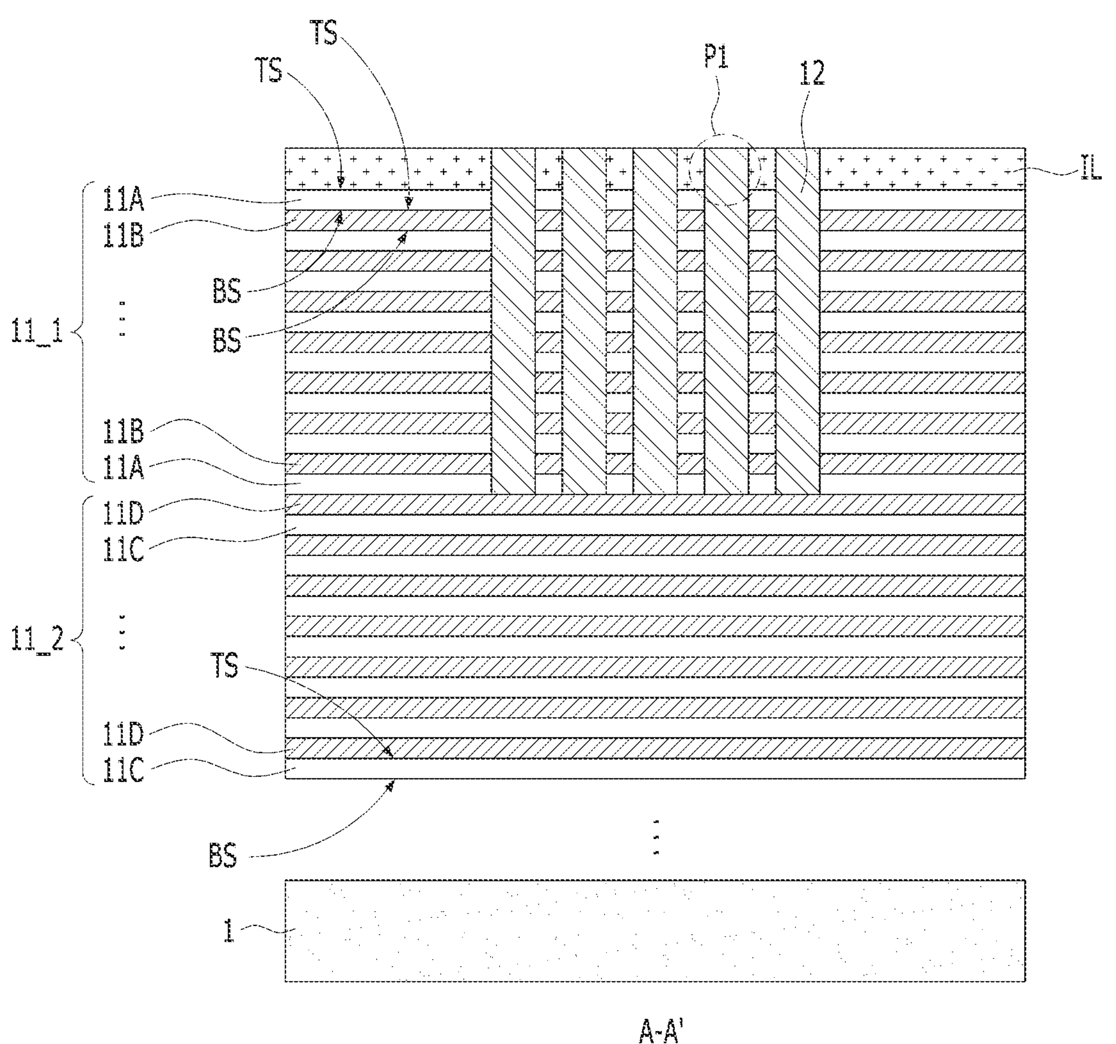
Figure 2C:
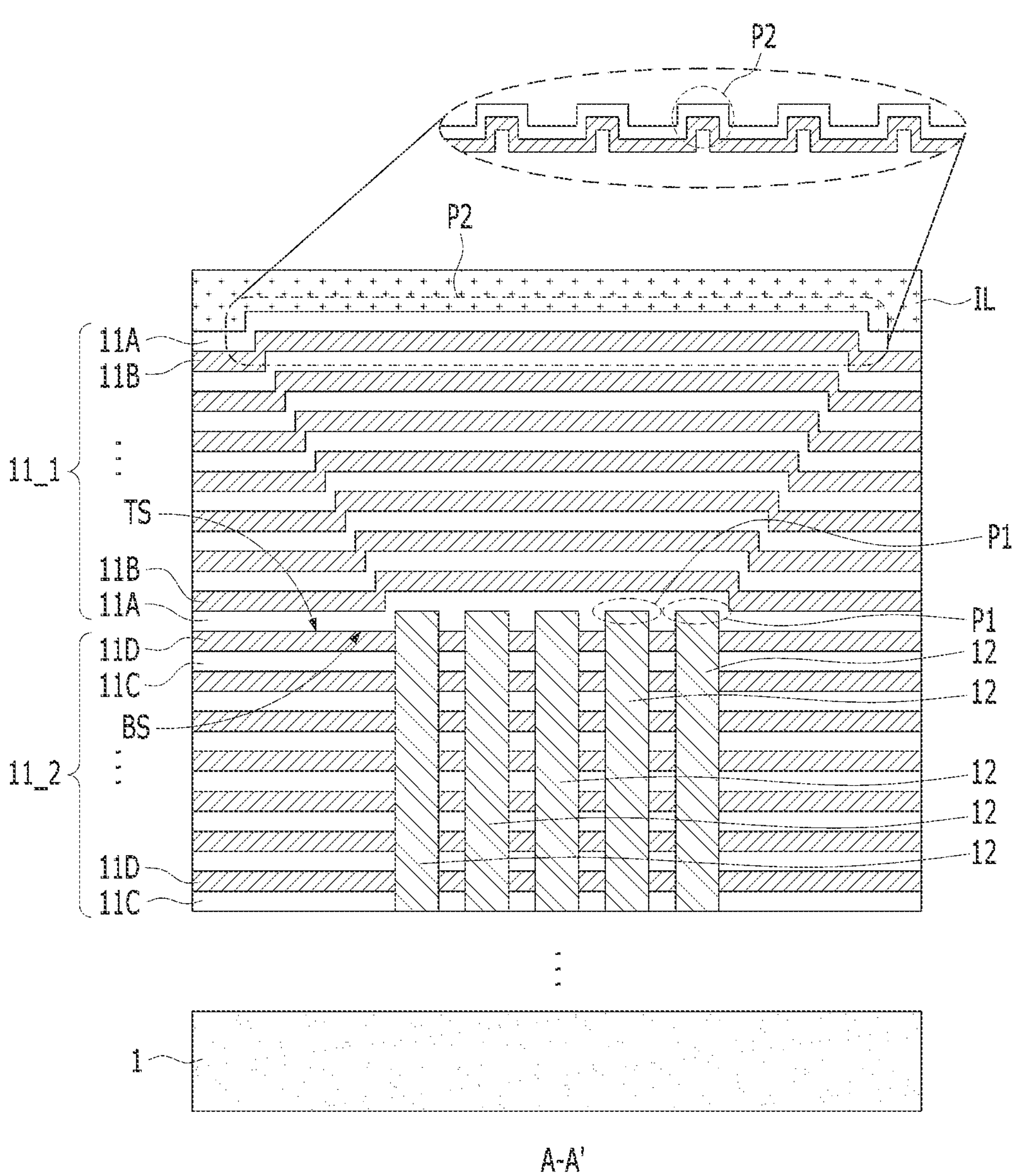
Figure 2D:
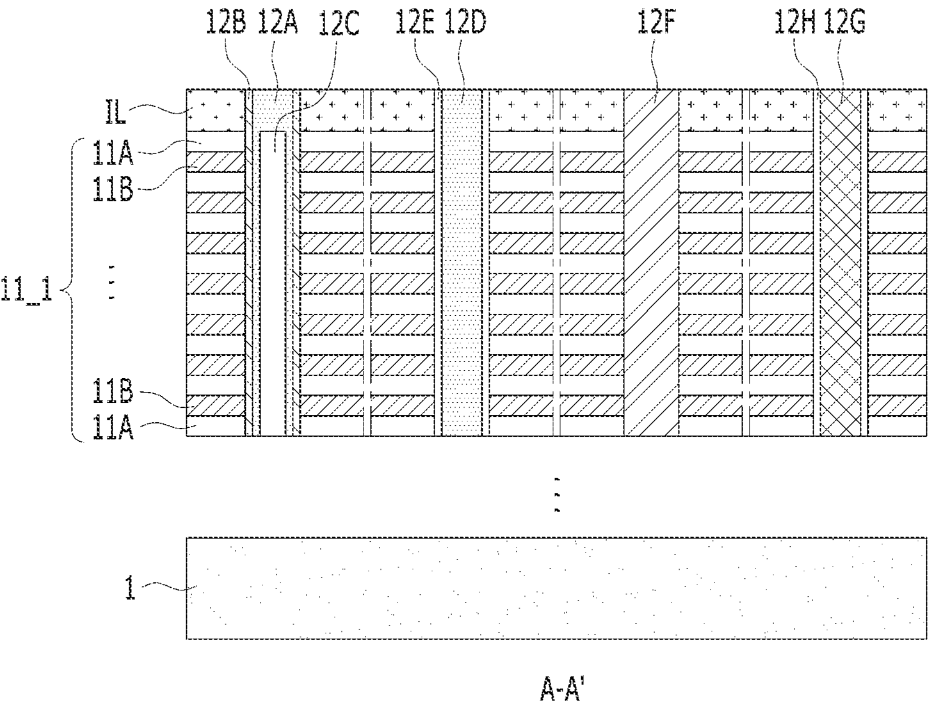

FIGS. 2A to 2D are diagrams illustrating a structure of a semiconductor device according to an embodiment of the present disclosure. FIGS. 2B to 2D may be cross-sectional views taken along section lines A-A' shown in FIG. 2A. Hereinafter, contents that are redundant with the aforementioned contents are omitted.

Referring to FIG. 2A, the semiconductor device may include alignment keys 12 that are disposed in the scribe lane area 3. For example, in an alternate embodiment, the semiconductor device may also include the alignment keys 12 that are disposed anywhere in the edge area 3A.

FIG. 2A depicts a top view of four sets of five alignment keys 12, which are conceptually depicted in the figure formed within four geometric quadrangles. Two such quadrangles are identified by broken lines identified by reference numerals G1 and G2, each broken line being drawn around a separate set of four, substantially identical rectangles. Those broken lines G1 and G2 thus surround corresponding groups of four substantially identical rectangles.

Because the alignment keys 12 themselves have a shape substantially the same as a rectangular parallelepiped or cuboid, in FIG. 2A, the top view of each alignment key 12 is represented by a rectangle. Each rectangle has substantially the same length, L, and substantially the same width, W. (In alternate embodiments, the dimensions of the alignment keys differ as do their shapes, which shapes nay include but are not limited to cubes, prisms and frustums.

The alignment keys 12 may be arranged in the first direction I, which in FIG. 2A is substantially orthogonal to the length, L, of the alignment keys 12 enclosed by broken line G1. The second direction II, is substantially orthogonal to the length, L, of the alignment keys 12 enclosed by broken line G2. The second direction II is orthogonal to and intersects the first direction I. The alignment keys 12 may include a first group G1 in which the alignment keys 12 have been arranged in the first direction I on a plane and a second group G2 in which the alignment keys 12 have been arranged in the second direction II on the plane. The alignment keys 12 may be arranged in a form in which the first group G1 and the second group G2 have been combined. For example, as shown in FIG. 2A, the alignment keys 12 may be arranged in (G2, G1, G2, G1), when considered clockwise. In alternate embodiment, the alignment keys 12 may be arranged in (G2, G2, G1, G1), when considered clockwise.

As used herein, the word "stack" refers to, and should be construed as a repeated layering of different materials on top of each other. For example, in FIG. 2B, reference numerals 11A and 11B identify layers of two different materials, which are repeatedly formed on top of each other and which thus comprise a first stack identified by reference numeral 11_1. A layer of a first type of material identified by reference numeral 11A is formed above or "on top of" a layer of a second type of material identified by reference numeral 11B.

In FIG. 2B, a stack, is a plurality of repeating layers of the 11A-type and 11B-type materials, (each layer being an 11A-type material layer formed over or on top of a 11B type material layer). A first "stack" is identified by reference numeral 11_1.

Similarly, reference numerals 11D and 11C identify layers of two different materials formed on top of each other. In FIG. 2B, several pairs of the 11C-type and 11D-type layers of material are considered herein as forming or comprising a second "stack," which is identified by reference numeral 11_2. FIG. 2B thus depicts two stacks.

Still referring to FIG. 2B, a first stack identified by reference numeral 11_1 is depicted as being located above or on top of a second stack identified by reference numeral 11_2. For claim construction purposes, however, the word "stack" should not be construed as requiring a particular directional orientation of the layers. Nor should "stack" be construed as being limited to only repeating layers of two different types of materials. "Stack" thus includes repeatedly layering two or more types of materials, regardless of the thickness of each layer. And for the sake of completeness, a "stack" includes the structure depicted in FIG. 2B, rotated such that the repeating layers 11A, 11B, 11C and 11D repeat horizontally.

Referring now to both FIGS. 2A and 2B, the semiconductor device comprises the substrate 1, a first stack 11_1, a second stack 11_2, and alignment keys 12. The semiconductor device may further include an interlayer insulating layer IL.

The first stack 11_1 comprises several alternating layers of 11A-type material and 11B-type material. As shown in FIG. 2B, which is a cross section of the first stack 11_1, each layer has a substantially planar top surfaces TS and substantially planar bottom surface, BS. The first stack 11_1 may be disposed in the scribe lane area 3. The first stack 11_1 may include first material layers 11A and second material layers 11B that are alternately stacked. The first stack 11_1 may also be disposed in the edge area 3A, i.e., not necessarily in the scribe lane area 3 but may be located anywhere between the chip area 2.

The second stack 11_2 may be disposed under and in direct contact with the first stack 11_1, such that the first stack 11_1 and the second stack 11_2 comprise one monolithic structure. The second stack 11_2 may include third material layers 11C and fourth material layers 11D that are alternately stacked. In this case, the first material layers 11A and the third material layers 11C may be insulating layers, with layers 11A and 11C comprised of the same or different dielectric/insulating materials. Similarly, the second material layers 11B and the fourth material layers 11D may be sacrificial layers, comprised of the same material or different materials in an alternate embodiment. The first material layers 11A or the third material layers 11C may include an oxide, one example of which being silicon oxide. The second material layers 11B or the fourth material layers 11D may include a nitride, one example of which being silicon nitride.

The alignment keys 12 are preferably disposed in the scribe lane area 3, which is preferably centered between chip areas 2. As stated above, however, the alignment keys 12 may also be disposed in the edge area 3A. The alignment keys 12 may be disposed within the first stack 11_1 or the second stack 11_2.

In a first embodiment shown in FIG. 2B, which shows five alignment keys 12, the alignment keys 12 may be disposed within the first stack 11_1. The alignment keys 12 have a shape, that is substantially the same as a rectangular parallelepiped. All five alignment keys 12 within the first stack 11_1 may extend above the top surface, TS, of the upper-most layer 11A of the first stack 11_1 and extend into or penetrate an interlayer insulating layer, IL, deposited on top of the top surface, TS, of the upper-most layer of the first stack 11_1. The interlayer insulating layer IL may thus be considered as being disposed on top of the first stack 11_1. Segments or portions of the alignment keys 12 that extend into or penetrate the interlayer insulating layer, IL, and which are identified as P1, are considered herein as first protrusion parts P1, because they protrude from above the top surface TS of the first stack 11_1 and into the IL layer. FIG. 2B shows five (5) protrusion parts P1, each one protruding substantially the same distance into the IL layer from a corresponding alignment key 12. In an alternate embodiment, however, alignment keys 12 may be formed to extend into the IL layer by different distances.

Each of the alignment keys 12 may include the first protrusion part P1 that protrudes from the top surface TS of the first stack 11_1. The alignment key 12 may be used as a reference point for aligning a mask pattern when the semiconductor chips are formed in the chip areas 2. In this case, the mask pattern may be used to form openings that are necessary when the semiconductor chips are formed. The mask pattern may be a photoresist pattern, and may be removed in a process of manufacturing the semiconductor device.

Although not illustrated in FIG. 2B a mask layer may be formed on the alignment keys 12 in a process of manufacturing the semiconductor device. In this case, the mask layer may be transparent or opaque. If the mask layer is opaque, the alignment keys 12 that are disposed under the mask layer might not be identifiable. Accordingly, a mask layer having a second protrusion part may be formed directly above the alignment keys 12, by forming an appropriate mask layer on the first protrusion part P1. Since a second protrusion part located directly above the alignment keys 12 is considered as being disposed in accordance with one of the five different protrusion parts P1, one or more second protrusion parts may be used as an alignment key when the semiconductor chips are formed. For example, a different second protrusion part may be used as a reference point for aligning a mask pattern that is necessary when at least one of channel structures, an isolation insulating layer, a source contact structure, supports, and a contact structure is formed in the chip areas 2. For reference, the mask layer including the second protrusion part may remain in the semiconductor chip or may be removed in a process of manufacturing the semiconductor device.

Referring to FIGS. 2A and 2C, five (5) alignment keys 12 may be disposed under the first stack 11_1, and within the second stack 11_2. The second stack 11_2 may include repeated layering of different materials on top of each other and in the second stack 11_2, those layers comprise the third material layers 11C and the fourth material layers 11D, which are considered herein as being alternately stacked. The five alignment keys 12 that are disposed within the second stack 11_2 may be used to form semiconductor chips. For example, the alignment keys 12 may be used as a reference point for aligning a mask pattern that is necessary when channel structures are formed in the chip areas 2. Each of the five alignment keys 12 embedded in the second stack 11_2, may include a first protrusion part P1, which extends above the top surface TS, of the upper-most material layer 11D of the second stack 11_2 which thus protrudes from the upper surface of the second stack 11_2. As shown in FIG. 2C, the first protrusion parts P1 of the alignment keys 12 formed above the second stack 11_2 extend or protrude into the bottom surface, BS of the bottom layer 11A of the first stack 11_1, which is essentially co-planar with the top surface, TS of the adjacent 11D layer.

The first stack 11_1 may be disposed on the second stack 11_2. The first stack 11_1 may include at least one, second protrusion part P2, which as shown in FIG. 2C, is above the top layer 11A, located directly above the first protruding portions P1 in the second stack 11_2 and extending into the IL layer that is on top of the first stack 11_1. For example, the first stack 11_1 may include the second protrusion part P2, which is disposed directly above the first protrusion parts P1 of the alignment keys 12 that are located in the second stack 11_2. The first stack 11_1 may include at least one, second protrusion part P2 for each of material layers 11A and 11B that comprises the several layers of the first stack 11_1. For example, a plurality of the second protrusion parts P2, each of which comprises a portion of a layer 11A that extends into a corresponding portion of an "overhead" layer 11B, may be disposed in accordance with a plurality of the first protrusion parts P1 disposed in the second stack 11_2, respectively. Alternatively, one second protrusion part P2 may be disposed in accordance with a plurality of the first protrusion parts P1.

Since the first stack 11_1 includes the second protrusion part P2, the locations of the alignment keys 12 that are disposed under the first stack 11_1 may be indirectly recognized even though one or more layers of the first stack 11_1 are opaque. Accordingly, the second protrusion part P2 may be used as an alignment key when the semiconductor chip is formed.

Referring to FIGS. 2A and 2D, the alignment keys 12 within the first stack 11_1 may correspond to various structures within the chip areas 2, and may include various forms. For example, the alignment keys 12 may be formed simultaneously with at least one of a channel structure, source contact structure, support, and contact structure of the chip areas 2, and may have similar structures.

The alignment keys 12 may be formed together when the channel structures of the chip areas 2 are formed, respectively, and may have structures similar to the channel structures. Each of the alignment keys 12 may be formed to include an inoperative or non-functioning "dummy" channel layer 12A as a dummy channel structure. The alignment key 12 may further include a dummy memory layer 12B that surrounds the dummy channel layer 12A or a dummy insulation core 12C within the dummy channel layer 12A or may further include a combination of them. The alignment keys 12 may include polysilicon, an oxide, or a nitride. For example, the alignment keys 12 may include silicon oxide or silicon nitride. For example, the dummy channel layer 12A may include polysilicon, and the dummy insulation core 12C may include polysilicon. The dummy memory layer 12B may include at least one of a dummy tunneling layer, a dummy data storage layer, and a dummy blocking layer. In this case, the dummy data storage layer may include a floating gate, a polysilicon layer, a charge trap material, a nitride layer, and a variable resistance material.

The alignment keys 12 may be formed together when the source contact structures of the chip areas 2 are formed, respectively, and may have structures similar to the source contact structures. In this case, the source contact structure may mean a source contact structure that is connected to a source structure disposed under a gate structure, through a gate structure. The alignment keys 12 may include a dummy source contact plug 12D or a first dummy insulation spacer 12E that surrounds the dummy source contact plug 12D as a dummy source contact structure. The alignment keys 12 may include a metal material, an oxide, or a nitride. For example, the dummy source contact plug 12D may include a metal material, such as tungsten. The first dummy insulation spacer 12E may include an insulating material, such as an oxide or a nitride.

The alignment keys 12 may be formed together when the supports of the chip areas 2 are formed, and may have structures similar to the supports. Alignment keys 12 may thus function as a dummy support 12F. Alignment keys 12 that function as a dummy support 12F may include an insulating material, such as an oxide or a nitride.

Each of the alignment keys 12 may be formed together when the contact structure of the chip areas 2 is formed, and may have a structure similar to the contact structure. In this case, the contact structure may mean a contact structure that is connected to a peripheral circuit disposed under a gate structure, through the gate structure. The alignment keys 12 may include a dummy contact plug 12G or a second dummy insulation spacer 12H that surrounds the dummy contact plug 12G. The dummy contact plug 12G may include a metal material, such as tungsten. A second dummy insulation spacer 12H may include an insulating material, such as an oxide or a nitride.

According to the aforementioned structure, the alignment keys 12 may be disposed in the scribe lane area 3 or in the edge area 3A. The alignment keys 12 may be disposed in the first stack 11_1 or the second stack 11_2 or may be disposed in the first stack 11_1 and the second stack 11_2. The first protrusion part P1 of the alignment keys 12 may be used as a reference point for aligning a mask pattern with the chip areas 2.

Figure 3A:
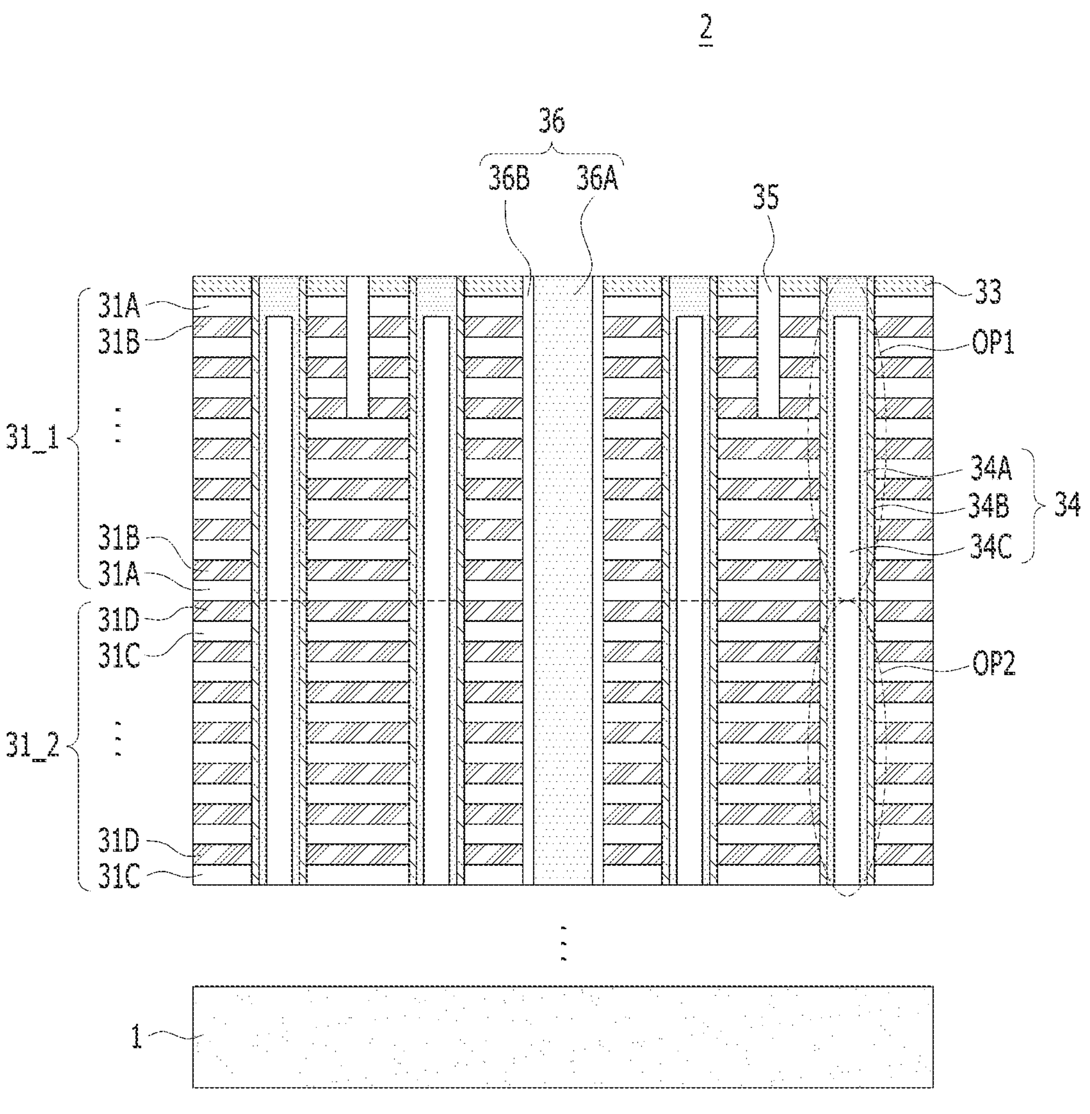
FIGS. 3A and 3B are diagrams illustrating a structure of a semiconductor device according to an embodiment of the present disclosure.
Figure 3B:
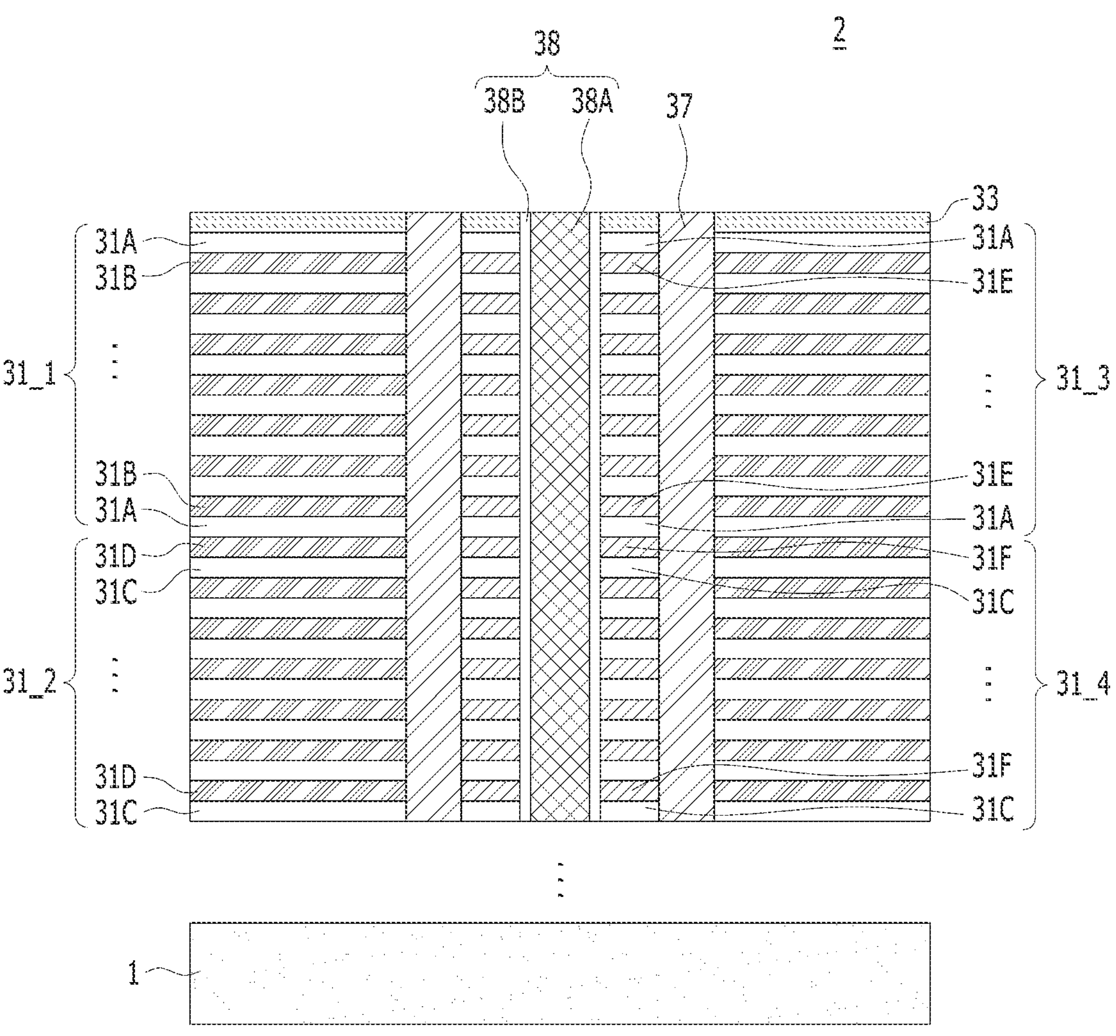

FIGS. 3A and 3B are diagrams illustrating a structure of a semiconductor device according to an embodiment of the present disclosure. Hereinafter, contents that are redundant with the aforementioned contents are omitted.

Referring to FIG. 3A, the semiconductor device may include a first gate structure 31_1, a second gate structure 31_2, channel structures 34, an isolation insulating layer 35, or a source contact structure 36 that is disposed in the chip areas 2. The semiconductor device may further include a mask layer 33 or the interlayer insulating layer IL or may further include a combination of them.

The first gate structure 31_1 may be disposed in the chip areas 2. The first gate structure 31_1 may be disposed at substantially the same level as the first stack 11_1 in FIG. 2B. The first gate structure 31_1 may include first insulating layers 31A and first conductive layers 31B that are alternately stacked. The first insulating layers 31A may be disposed at substantially the same level as the first material layers 11A of the first stack 11_1, respectively. The first conductive layers 31B may be disposed in at substantially the same level as the second material layers 11B, respectively. In this case, the first conductive layers 31B may include a metal material, such as tungsten. The first insulating layers 31A may include an insulating material, such as an oxide. The first conductive layers 31B may be a word line, a bit line, or a selection line.

The second gate structure 31_2 may be disposed in the chip areas 2. The second gate structure 31_2 may be disposed under the first gate structure 31_1. The second gate structure 31_2 may be disposed at substantially the same level as the second stack 11_2 in FIGS. 2B and 2C. The second gate structure 31_2 may include second insulating layers 31C and second conductive layers 31D that are alternately stacked. The second insulating layers 31C may be disposed at substantially the same level as the third material layers 11C of the second stack 11_2, respectively. The second conductive layers 31D may be disposed at substantially the same level as the fourth material layers 11D, respectively. In this case, the second conductive layers 31D may include a metal material, such as tungsten. The second insulating layers 31A may include an insulating material, such as an oxide. Furthermore, the second conductive layers 31D may be a word line, a bit line, or a selection line.

The mask layer 33 may be disposed on the first gate structure 31_1. The mask layer 33 may be used to form, in the scribe lane area 3, the alignment keys 12 in FIGS. 2B to 2D. For example, in a process of manufacturing the semiconductor device, in order to form the first protrusion parts P1 of the alignment keys 12, the mask layer 33 may be etched. The mask layer 33 of the chip areas 2 may have remained without being removed in a process of manufacturing the semiconductor device. The mask layer 33 may include an insulating material, such as an oxide or a nitride.

Channel structures 34 may be disposed within the first gate structure 31_1 and the second gate structure 31_2. Each of the channel structures 34 may include a channel layer 34A and a memory layer 34B that surrounds the channel layer 34A. Each of the channel structures 34 may further include an insulating core 34C within the channel layer 34A.

For example, the first gate structure 31_1 may include a first opening OP1. The second gate structure 31_2 may include a second opening OP2 that is connected to the first opening OP1. The channel structure 34 may be disposed within the first opening OP1 and the second opening OP2. The first opening OP1 may be disposed at substantially the same level as the alignment keys 12 in FIG. 2B. The second opening OP2 may be disposed at substantially the same level as the alignment keys 12 in FIG. 2C. The channel structures 34 may be formed when the alignment keys 12 are formed or may be formed by using the alignment keys 12.

The channel structures 34 may be formed together when the alignment keys 12 in FIG. 2B are formed. For example, the channel layer 34A may be formed together with the dummy channel layer 12A, and the memory layer 34B may be formed together with the dummy memory layer 12B. Furthermore, the insulating core 34C may be formed together with the dummy insulation core 12C. The memory layer 34B may include a blocking layer, a data storage layer, or a tunneling layer. The insulating core 34C may include an insulating material, such as an oxide, a nitride, or an air gap.

The channel structures 34 may be formed by using the alignment keys 12 in FIG. 2C. For example, the second opening OP2 may be formed when the alignment keys 12 in FIG. 2C are formed, or the first opening OP1 may be formed by using the alignment keys 12 in FIG. 2C.

The isolation insulating layers 35 may be disposed in the chip areas 2. The isolation insulating layers 35 may be disposed within the first gate structure 31_1, and as an example, may be extended into the second gate structure 31_2. Each of the isolation insulating layers 35 may be disposed between the channel structures 34 or may be overlapped with the channel structures 34. The isolation insulating layers 35 may insulate at least some of the conductive layers 31B and 31D that are included in the gate structures 31_1 and 31_2. The isolation insulating layers 35 may include an insulating material, such as an oxide, a nitride, or an air gap.

The isolation insulating layers 35 may be formed together when the alignment keys 12 in FIG. 2B are formed. The isolation insulating layers 35 may be formed by using the alignment keys 12 in FIG. 2B or 2C.

The source contact structure 36 may include a source contact plug 36A, and may further include an insulating spacer 36B. The source contact structure 36 may be disposed within the first gate structure 31_1, and may be extended into the second gate structure 31_2. The source contact plug 36A may include polysilicon or metal. The insulating spacer 36B may include an insulating material, such as an oxide, a nitride, or an air gap.

The source contact structure 36 may be formed together when at least some of the alignment keys 12 in FIGS. 2B to 2D are formed. For example, the source contact plug 36A may be formed when the dummy source contact plug 12D is formed. The insulating spacer 36B may be formed when the first dummy insulation spacer 12E is formed.

The source contact structure 36 may be formed together when at least one of the alignment keys 12 in FIGS. 2B to 2D is formed. For example, a mask pattern may be aligned through the alignment keys 12. The source contact structure 36 may be formed by using the aligned mask pattern as an etch barrier.

Referring to FIG. 3B, the semiconductor device may include a first cell stack 31_3, a second cell stack 31_4, supports 37, or a contact structure 38 that is disposed in the chip areas 2.

The first cell stack 31_3 may be disposed at substantially the same level as the first gate structure 31_1. The first cell stack 31_3 may be disposed at substantially the same level as the first stack 11_1 in FIG. 2B. When the first stack 11_1 is formed, the first cell stack 31_3 may be formed. The first cell stack 31_3 may include first insulating layers 31A and first sacrificial layers 31E that are alternately stacked. The first sacrificial layers 31E may remain without being substituted with the first conductive layers 31B in a process of manufacturing the semiconductor device. Each of the first sacrificial layers 31E and each of the first conductive layers 31B may be disposed at substantially the same level.

The second cell stack 31_4 may be disposed under the first cell stack 31_3. The second cell stack 31_4 may be disposed substantially at the same level as the second gate structure 31_2. The second cell stack 31_4 may be disposed at substantially the same level as the second stack 11_2 in FIG. 2B. When the second stack 11_2 is formed, the second cell stack 31_4 may be formed. The second cell stack 31_4 may include second insulating layers 31C and second sacrificial layers 31F that are alternately stacked. The second sacrificial layers 31F may be disposed at substantially the same level as the second conductive layers 31D, respectively.

The contact structure 38 may be disposed in the chip areas 2. The contact structure 38 may include a contact plug 38A or an insulating spacer 38B that surrounds the contact plug 38A. The contact structure 38 may be disposed within the first cell stack 31_3, and may be extended into the second cell stack 31_4. The contact plug 38A may include a metal material, such as tungsten. The insulating spacer 38B may include an insulating material, such as an air gap, an oxide or a nitride.

The contact structure 38 may be formed together when at least one of the alignment keys 12 in FIGS. 2B to 2D is formed. For example, the contact plug 38A may be formed when the dummy contact plug 12G is formed. The insulating spacer 38B may be formed when the second dummy insulation spacer 12H is formed.

The contact structure 38 may be formed by using at least one of the alignment keys 12 in FIGS. 2B to 2D. For example, a mask pattern may be aligned through the alignment keys 12. The source contact structure 36 may be formed by using the aligned mask pattern as an etch barrier.

The supports 37 may be disposed in the chip areas 2. Each of the supports 37 may be disposed between the first cell stack 31_3 and the first gate structure 31_1. For example, each of the supports 37 may penetrate the first cell stack 31_3 or the first gate structure 31_1.

The support 37 may be for preventing the cell stacks 31_3 and 31_4 or the gate structures 31_1 and 31_2 from inclining or for reducing the inclination of the cell stacks 31_3 and 31_4 or the gate structures 31_1 and 31_2 in a process of substituting the sacrificial layers 31E and 31F with the conductive layers 31B and 31D. For example, the sacrificial layers 31E and 31F on one side of the support 37 may be substituted with the conductive layers 31B and 31D. The sacrificial layers 31E and 31F on the other side of the support 37 may remain. The supports 37 may include an insulating material, such as an oxide, a nitride, or an air gap.

The supports 37 may be formed together with at least one of the alignment keys 12 in FIGS. 2B to 2D. The supports 37 may be formed by using at least one of the alignment keys 12 in FIGS. 2B to 2D. For example, a mask pattern may be aligned through the alignment keys 12. The supports 37 may be formed by using the aligned mask pattern as an etch barrier.

According to the aforementioned structure, at least one of the channel structures 34, the source contact structure 36, the contact structure 38, and the supports 37 that are disposed in the chip areas 2 and the alignment keys 12 of the scribe lane area 3 may be formed together, and may have similar structures. Accordingly, the alignment keys can be formed in the scribe lane area without adding a separate process.

Furthermore, at least one of the channel structures 34, the isolation insulating layers 35, the source contact structure 36, the supports 37, and the contact structure 38 in the chip areas 2 may be formed by using the alignment keys 12.

Figure 4:
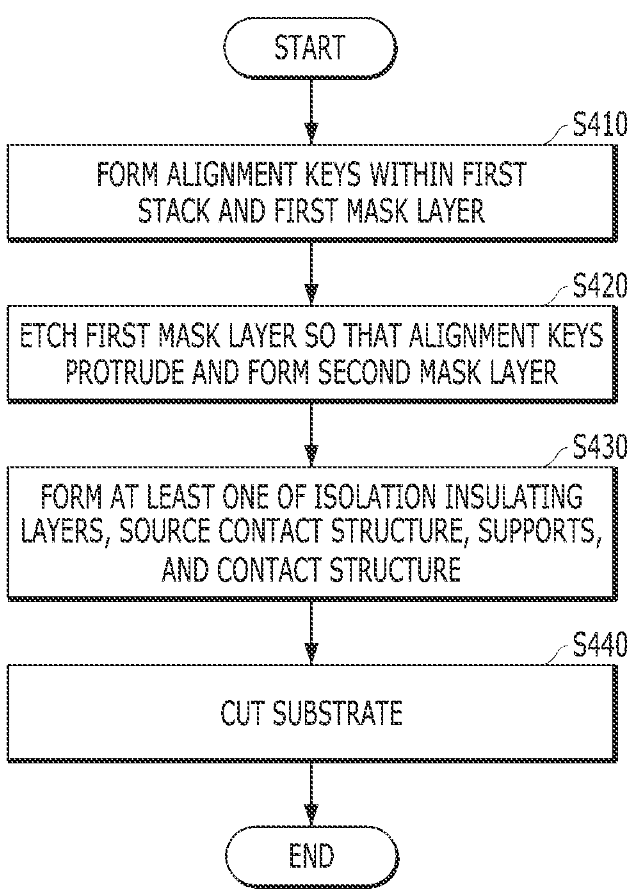
FIG. 4 is a flowchart of a method of manufacturing a semiconductor device according to an embodiment of the present disclosure.

FIG. 4 is a flowchart of a method of manufacturing a semiconductor device according to an embodiment of the present disclosure. Hereinafter, contents that are redundant with the aforementioned contents are omitted.

Referring to FIG. 4, a first stack and a first mask layer may be formed in a scribe lane area of a substrate. Alignment keys may be formed within the first stack and the first mask layer (S410). The scribe lane area may be disposed between chip areas of the substrate.

Subsequently, the first mask layer may be etched so that the alignment keys protrude as described above, and a second mask layer may be formed (S420). The second mask layer may include protrusion parts that are disposed in accordance with the alignment keys.

Subsequently, at least one of isolation insulating layers, a source contact structure, supports, and a contact structure may be formed in the chip areas of the substrate (S430). A mask pattern having a specific structure may be formed by using the alignment keys of the scribe lane area. A specific structure may be formed by using the mask pattern as an etch barrier.

Subsequently, the substrate may be cut along or through the scribe lane area (S440) using techniques well known to those of ordinary skill in the art. When the substrate is cut, the alignment keys may be broken, but may also remain in the edge area of the substrate.

Figure 5:
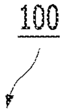
FIGS. 5, 6A and 6B, 7A and 7B, 8A and 8B, 9A and 9B, and 10A and 10B are diagrams for describing a method of manufacturing a semiconductor device according to an embodiment of the present disclosure.
Figure 5:
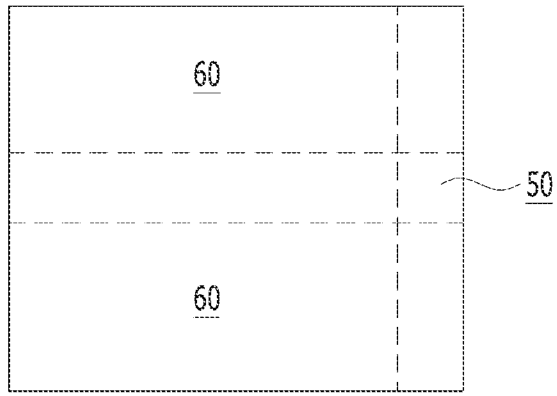

FIGS. 5, 6A and 6B, 7A and 7B, 8A and 8B, 9A and 9B, and 10A and 10B are diagrams for describing a method of manufacturing a semiconductor device according to an embodiment of the present disclosure. FIG. 5 may be a layout of a substrate 100. A figure "A" in each of FIGS. 6A and 6B, 7A and 7B, 8A and 8B, 9A and 9B, and 10A and 10B may be a cross-sectional view of a scribe lane area 50. A figure "B" in each of FIGS. 6A and 6B, 7A and 7B, 8A and 8B, 9A and 9B, and 10A and 10B may be a cross-sectional view of a chip area 60.

Referring to FIG. 5, the substrate 100 may include the scribe lane area 50 and the chip area 60. The chip area 60 may be an area in which semiconductor chips will be formed. The scribe lane area 50 may be disposed between the chip areas 60.

Figure 6A:
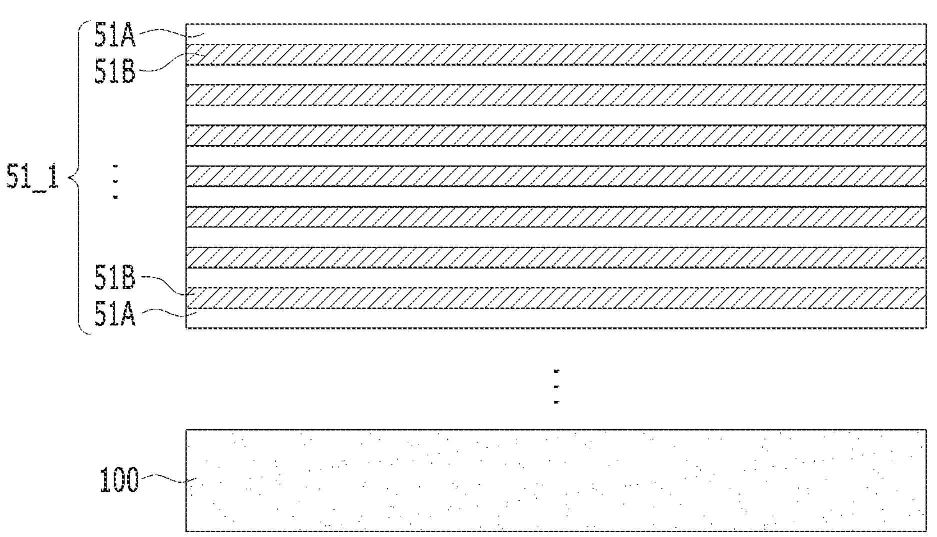
Figure 6B:
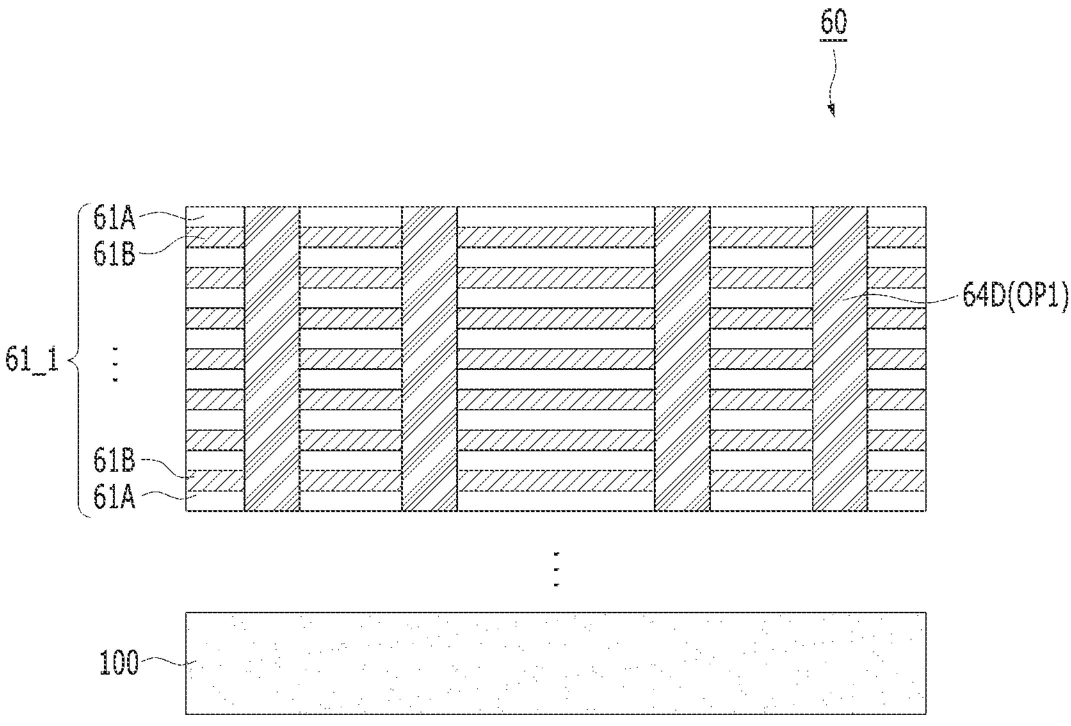

Referring to FIGS. 5, 6A, and 6B, a first stack 51_1 may be formed in the scribe lane area 50 of the substrate 100. The first stack 51_1 may include first material layers 51A and second material layers 51B that are alternately stacked. The first material layers 51A may include an insulating material, such as an oxide. The second material layers 51B may include a sacrificial material, such as a nitride.

A first cell stack 61_1 may be formed in the chip area 60. When the first stack 51_1 of the scribe lane area 50 is formed, the first cell stack 61_1 may be formed in the chip area 60. The first cell stack 61_1 may include first material layers 61A and second material layers 61B that are alternately stacked. The first material layers 61A may include an insulating material, such as an oxide. The second material layers 61B may include a sacrificial material, such as a nitride.

Subsequently, sacrificial layers 64D may be formed in the chip areas 60. The sacrificial layers 64D may be formed within the first cell stack 61_1. The sacrificial layers 64D may include a sacrificial material, such as tungsten.

Figure 7A:
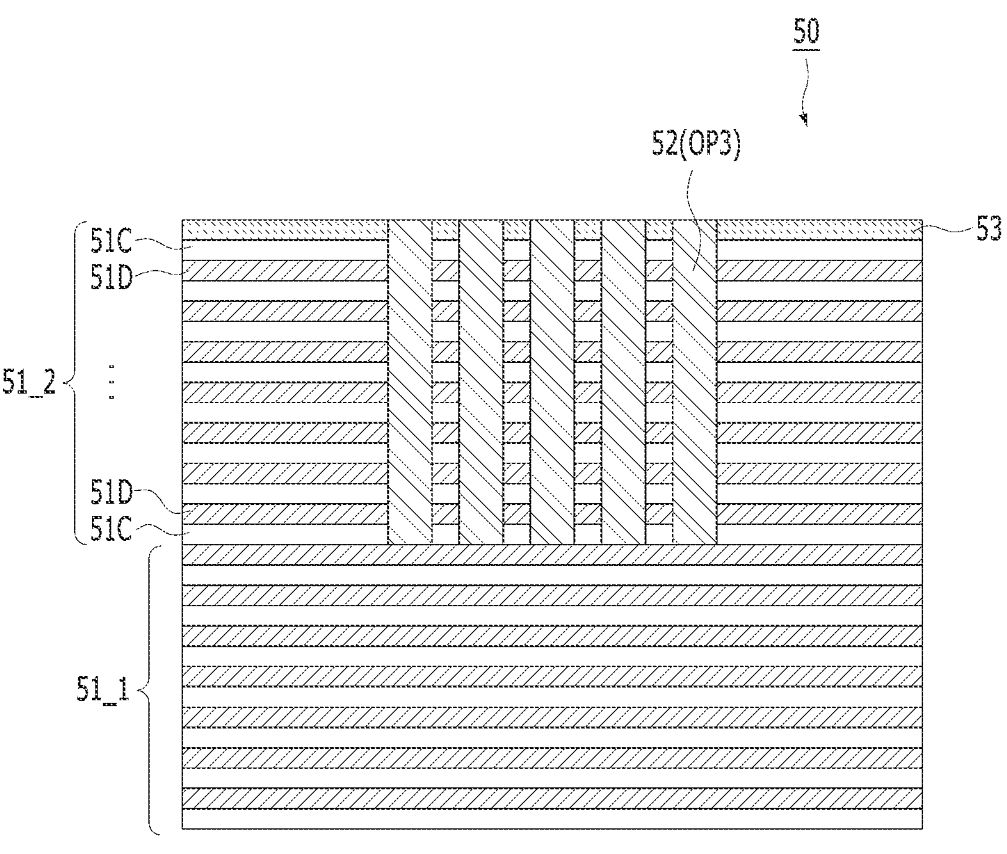

Referring to FIGS. 5 and 7A, a second stack 51_2 may be formed in the scribe lane area 50. The second stack 51_2 may include third material layers 51C and fourth material layers 51D that are alternately stacked. The third material layers 51C may include an insulating material, such as an oxide. The fourth material layers 51D may include a sacrificial material, such as a nitride. Subsequently, a first mask layer 53 may be formed on the second stack 51_2. The first mask layer 53 may include an insulating material, such as an oxide or a nitride.

Subsequently, the alignment keys 52 may be formed. First, third openings OP3 may be formed. The third openings OP3 may be formed so that the first stack 51_1 is exposed within the second stack 51_2. Subsequently, alignment keys 52 may form within the third openings OP3, respectively.

Figure 7B:
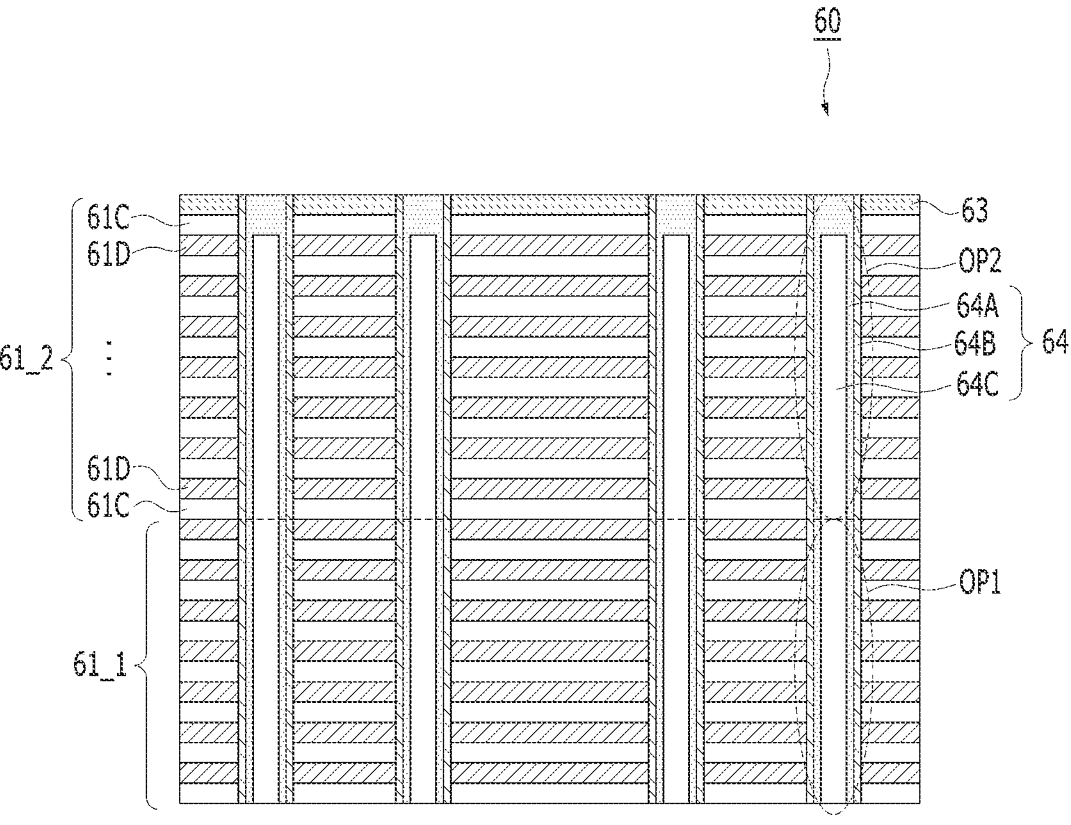

Referring to FIGS. 5, 7A, and 7B, a second cell stack 61_2 may be formed on the first cell stack 61_1 of the chip area 60. When the second stack 51_2 is formed in the scribe lane area 50, the second cell stack 61_2 may be formed. The second cell stack 61_2 may include third material layers 61C and fourth material layers 61D that are alternately stacked. The third material layers 61C may include an insulating material, such as an oxide. The fourth material layers 61D may include a sacrificial material, such as a nitride.

Subsequently, a first mask layer 63 may be formed on the second cell stack 61_2. The first mask layer 63 may be disposed at substantially the same level as the first mask layer 53 of the scribe lane area 50, and may be formed as a single layer.

Subsequently, channel structures 64 may be formed. First, second openings OP2 that are connected to first openings OP1 may be formed within the second cell stack 61_2. When the third openings OP3 of the scribe lane area 50 are formed, the second openings OP2 may be formed. Subsequently, the sacrificial layers 64D may be removed through the second openings OP2. The channel structures 64 may be formed within the first openings OP1 and the second openings OP2. When the alignment keys 52 are formed, the channel structures 64 may be formed. Each of the channel structures 64 may include at least one of a channel layer 64A, a memory layer 64B that surrounds the channel layer 64A, and an insulating core 64C within the channel layer 64A.

Figure 8A:
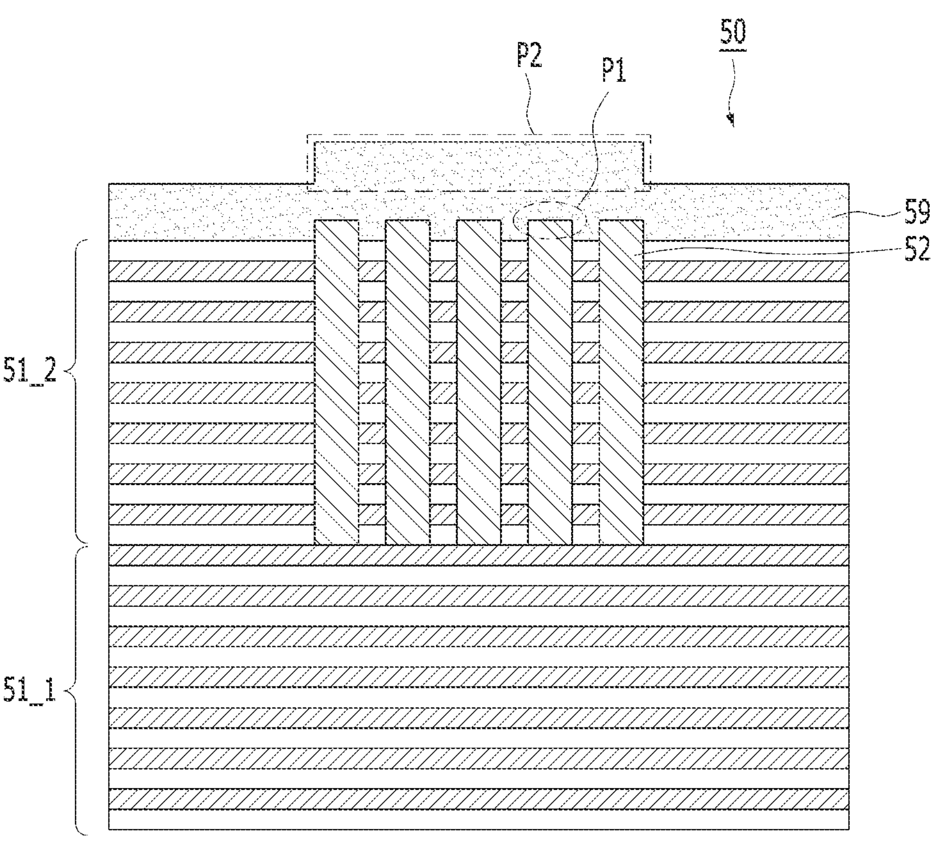
Figure 8B:
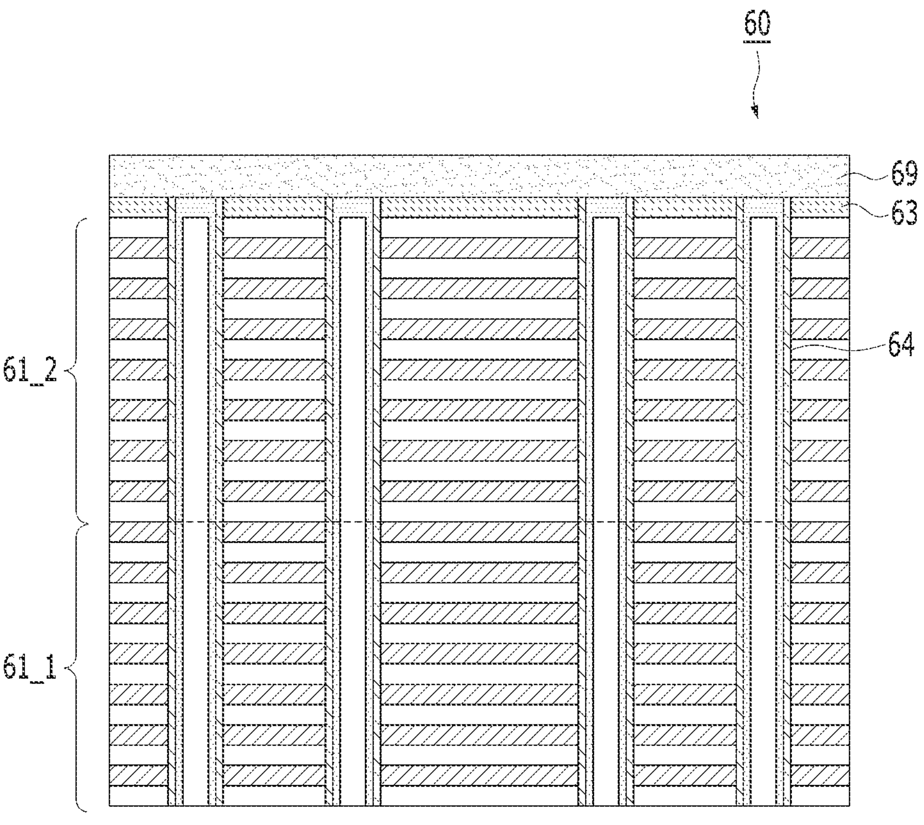

Referring to FIGS. 5, 8A, and 8B, the first mask layer 53 may be etched so that the alignment keys 52 protrude from the upper surface of the second stack 51_2. For example, the alignment keys 52 may protrude by selectively etching the first mask layer 53. Accordingly, the first mask layer 53 of the scribe lane area 50 may be removed, and the first mask layer 63 of the chip areas 60 may remain. In this case, the protruded part of each of the alignment keys 52 may be defined as a first protrusion part P1.

Subsequently, a second mask layer 59 may be formed on the second stack 51_2. The second mask layer 59 may include a protrusion part that is disposed in accordance with the alignment keys 52. The protruded part of the second mask layer 59 may be defined as a second protrusion part P2.

The second mask layer 59 may include a material having high etch selectivity to the stacks 51_1 and 51_2. For example, the second mask layer 59 may include carbon. The second mask layer 59 may include a carbon layer that is formed in a high-temperature process or a carbon layer into which metal has been doped. The second mask layer 59 may include a transparent material or may include an opaque material. For example, the second mask layer 59 may include an opaque material.

If the second mask layer 59 is opaque, the alignment keys 52 that is formed under the second mask layer 59 might not be recognized. According to various embodiments of the present disclosure, each of the alignment keys 52 may be formed to include the first protrusion part P1. The second mask layer 59 may be formed to include the second protrusion part P2 at a location corresponding to the first protrusion part P1. Accordingly, the locations of the alignment keys 52 may be indirectly recognized by the second protrusion part P2 of the second mask layer 59.

When the second mask layer 59 of the scribe lane area 50 is formed, a second mask layer 69 may be formed in the chip areas 60. Since there is no part that protrudes from the upper surface of the second cell stack 61_2, the second mask layer 59 that has been formed on the second cell stack 61_2 might not include a protruded part, and may include a flat upper surface.

Figure 9A:
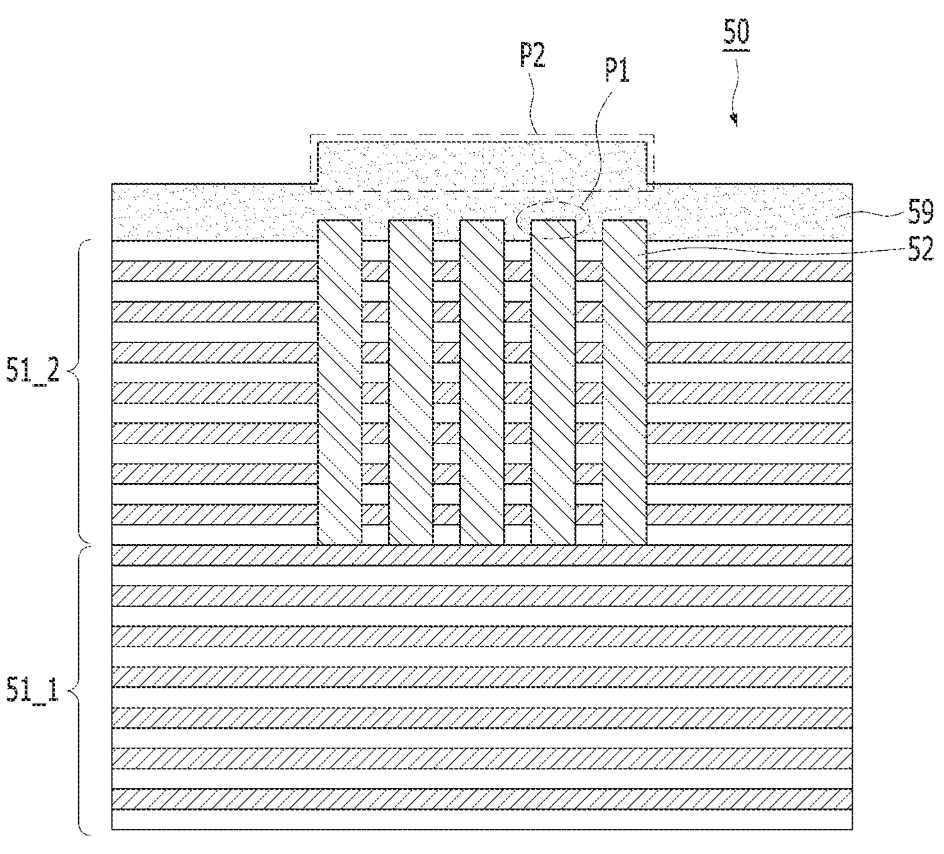
Figure 9B:
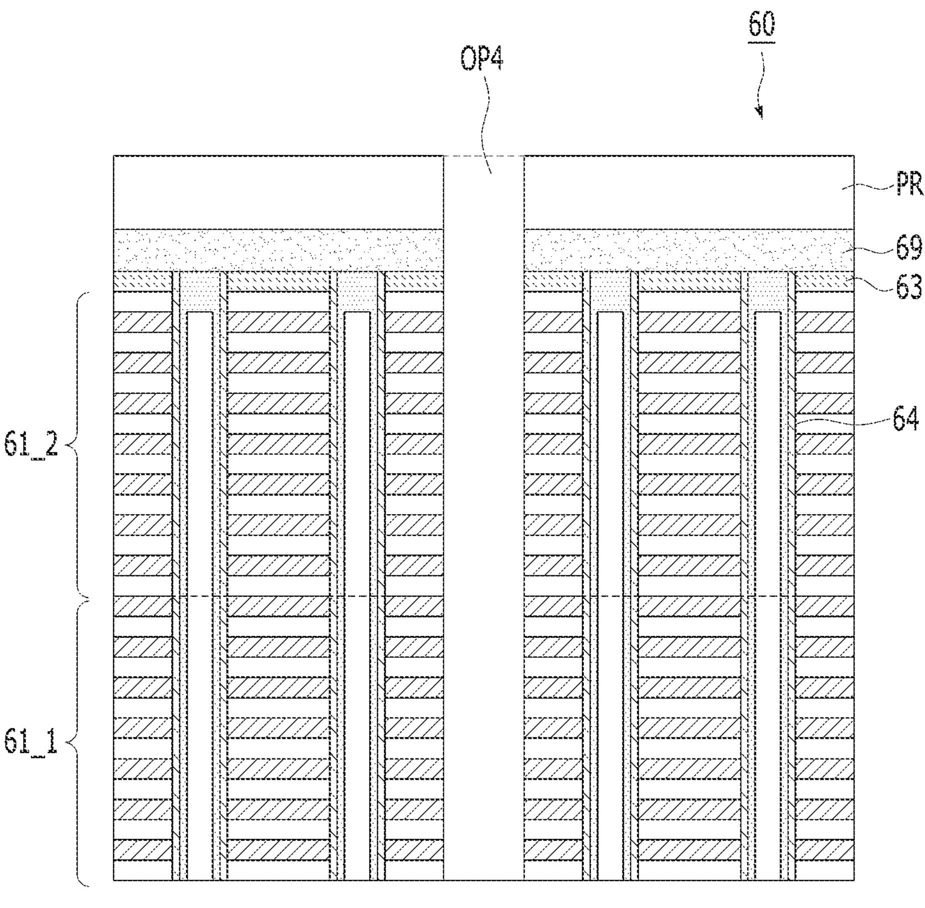

Referring to FIGS. 5, 9A, and 9B, a fourth opening OP4 may be formed in the chip areas 60. First, a mask pattern PR may be aligned in the chip areas 60 by using the alignment keys 52 of the scribe lane area 50. Subsequently, the fourth opening OP4 may be formed by etching the second mask layer 69, the first mask layer 63, the second cell stack 61_2, and the first cell stack 61_1 by using the mask pattern PR as an etch barrier. The fourth opening OP4 may be formed to penetrate only some of the second mask layer 69, the first mask layer 63, the second cell stack 61_2, and the first cell stack 61_1.

The second mask layer 59 of the scribe lane area 50 can prevent the alignment keys 52 from being damaged or reduce damage to the alignment keys 52, in a process of forming the fourth opening OP4 by forming the mask pattern PR in the chip areas 60. For example, the second mask layer 59 of the scribe lane area 50 can prevent the alignment keys 52 from being damaged by gas or a solution that is used to form the fourth opening OP4 or can reduce damage to the alignment keys 52, which is attributable to gas or a solution that is used to form the fourth opening OP4. The mask pattern PR and the second mask layer 59, 69 may remain or may be removed in a process of manufacturing the semiconductor device. For example, the mask pattern PR and the second mask layer 59, 69 may be removed.

Figure 10A:
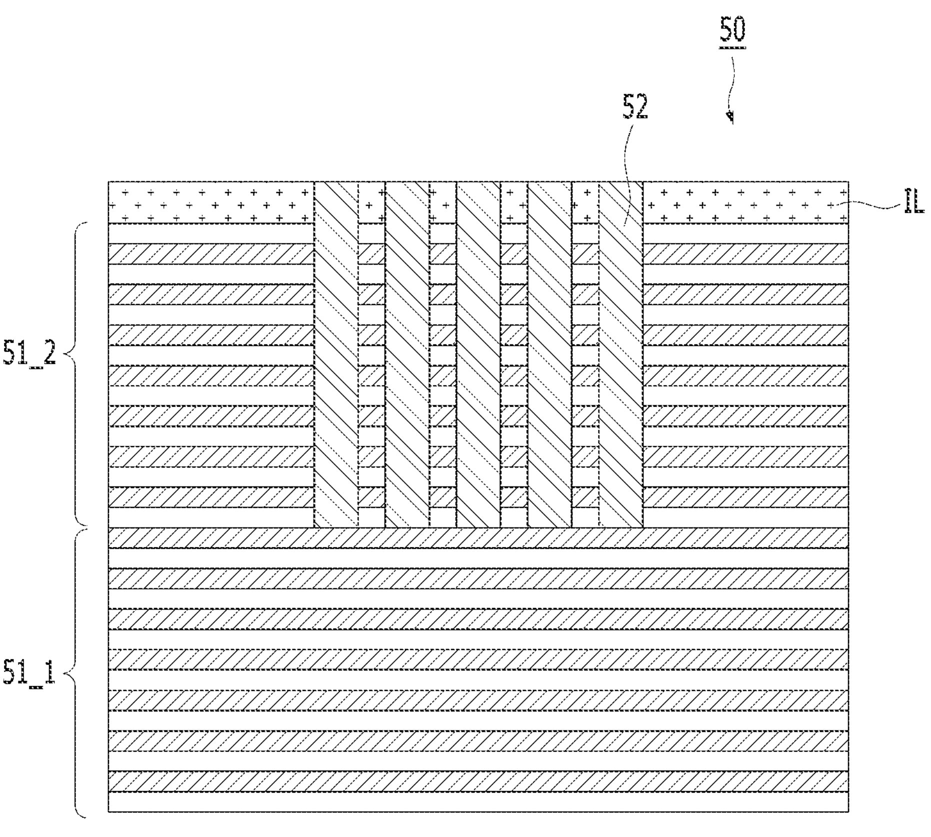
Figure 10B:
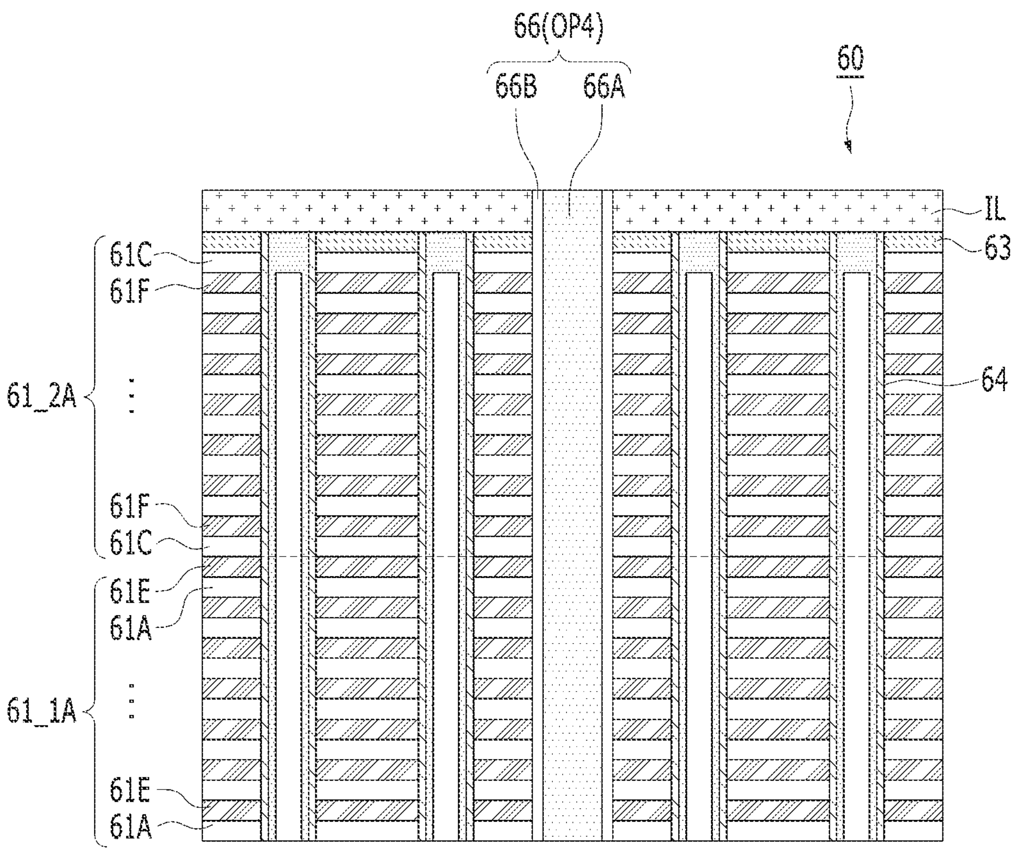

Referring to FIGS. 5, 10A, and 10B, an interlayer insulating layer IL may be formed in the scribe lane area 50. First, the second mask layer 59 may be removed. Subsequently, the interlayer insulating layer IL may be formed on the second stack 51_2. The interlayer insulating layer IL may be formed at substantially the same level as the upper surface of the alignment keys 52. However, the present disclosure is not limited thereto, and the interlayer insulating layer IL may be formed to cover the upper surface of the alignment keys 52.

A source contact structure 66 may be formed in the chip areas 60. First, when the second mask layer 59 of the scribe lane area 50 is removed, the second mask layer 69 of the chip areas 60 may be removed. Subsequently, the source contact structure 66 may be formed within the fourth opening OP4. The source contact structure 66 may include a source contact plug 66A and an insulating spacer 66B that surrounds the source contact plug 66A. For reference, the present disclosure is not limited to an example in which the source contact structure 66 is formed within the fourth opening OP4. For example, at least one of isolation insulating layers, supports, and a contact structure may be formed within the fourth opening OP4.

Subsequently, the interlayer insulating layer IL may be formed in the chip areas 60. When the interlayer insulating layer IL of the scribe lane area 50 is formed, the interlayer insulating layer IL of the chip areas 60 may be formed.

Subsequently, the substrate 100 may be cut. For example, the substrate 100 may be cut along the scribe lane area 50. Accordingly, the substrate 100 may include the chip area 60 and an edge area that surrounds the chip area 60. At least one of the stacks 51_1 and 51_2 and the alignment keys 52 of the scribe lane area 50 may remain in the edge area.

For reference, when the alignment keys 52 of the scribe lane area 50 are formed, at least one of the source contact structure 66, isolation insulating layers, supports, and contact structure may be formed. For example, when a mask pattern for forming the alignment keys 52 is aligned in the scribe lane area 50, the same mask pattern may be aligned in the chip areas 60. Accordingly, the alignment keys, the source contact structure 66, the isolation insulating layers, the supports, and the contact structure having similar structures may be formed in the scribe lane area 50 and the chip areas 60.

Furthermore, before the source contact structure 66 is formed, the second and fourth material layers 61B and 61D of the cell stacks 61_1 and 61_2 may be substituted with conductive layers 61E and 61F. The second and fourth material layers 61B and 61D may be removed through the fourth opening OP4, and may be substituted with the conductive layers 61E and 61F. The conductive layers 61E and 61F may include a metal material, such as tungsten, or may include a silicide material. Accordingly, a first gate structure 61_1A, including first insulating layers 61A and first conductive layers 61E that are alternately stacked, and a second gate structure 61_2A, including second insulating layers 61C and second conductive layers 61F that are alternately stacked, may be defined.

The second and fourth material layers 61B and 61D may be completely substituted with the conductive layers 61E and 61F, respectively, or parts of the second and fourth material layers 61B and 61D may be substituted with the conductive layers 61E and 61F. Parts that are included in the second and fourth material layers 61B and 61D and that are close to the second opening OP2 may be substituted with the conductive layers 61E and 61F, and an isolated part thereof may remain.

According to the aforementioned process, the degree of integration of semiconductor chips can be improved by forming the alignment keys 52 in the scribe lane area 50 not the chip areas 60.

Furthermore, as the alignment keys 52 including the first protrusion part P1 are formed in the scribe lane area 50, the second mask layer 59 including the second protrusion part P2 may be formed. Accordingly, the mask pattern PR may be aligned in the chip areas 60 by using the second protrusion part P2 of the second mask layer 59 as an alignment key.

Furthermore, when the alignment keys 52 are formed in the scribe lane area 50, the channel structures 64, the isolation insulating layers, the source contact structure 66, the supports, or the contact structure may be formed in the chip areas 60. Accordingly, the alignment keys 52 can be formed in the scribe lane area 50 without adding a separate process.

Figure 11:
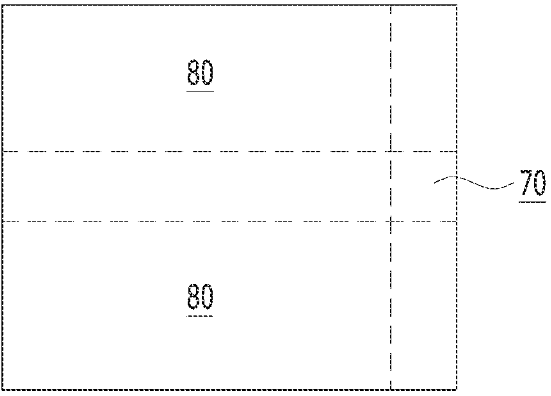
FIGS. 11, 12A and 12B, 13A and 13B, 14A and 14B, and 15A and 15B are diagrams for describing a method of manufacturing a semiconductor device according to an embodiment of the present disclosure.

FIGS. 11, 12A and 12B, 13A and 13B, 14A and 14B, and 15A and 15B are diagrams for describing a method of manufacturing a semiconductor device according to an embodiment of the present disclosure. FIG. 11 may be a layout of the substrate 100. A figure "A" in each of FIGS. 12A and 12B, 13A and 13B, 14A and 14B, and 15A and 15B may be a cross-sectional view of a scribe lane area 70. A figure "B" in each of FIGS. 12A and 12B, 13A and 13B, 14A and 14B, and 15A and 15B may be a cross-sectional view of a chip area 80. Hereinafter, contents that are redundant with the aforementioned contents are omitted.

Figure 12A:
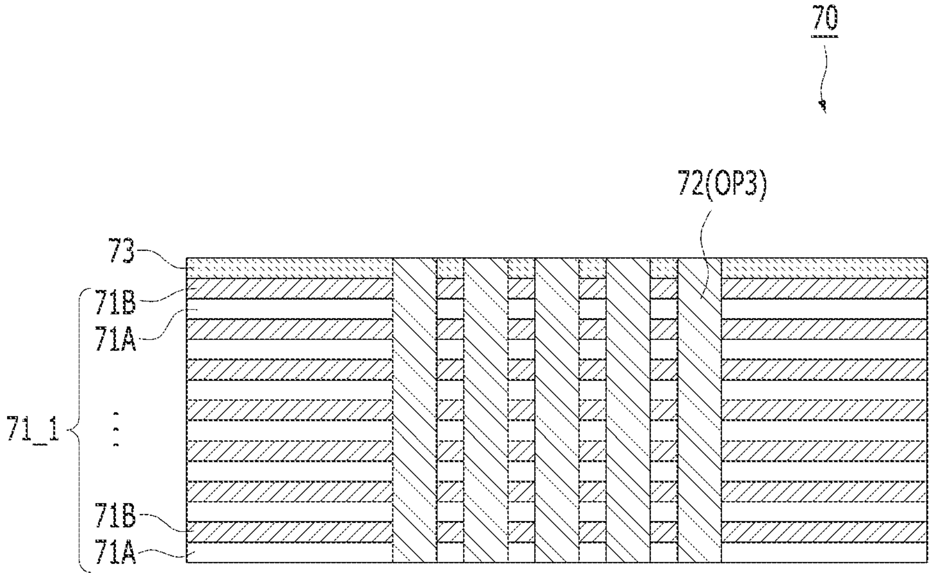
Figure 12B:
Figure 12B:
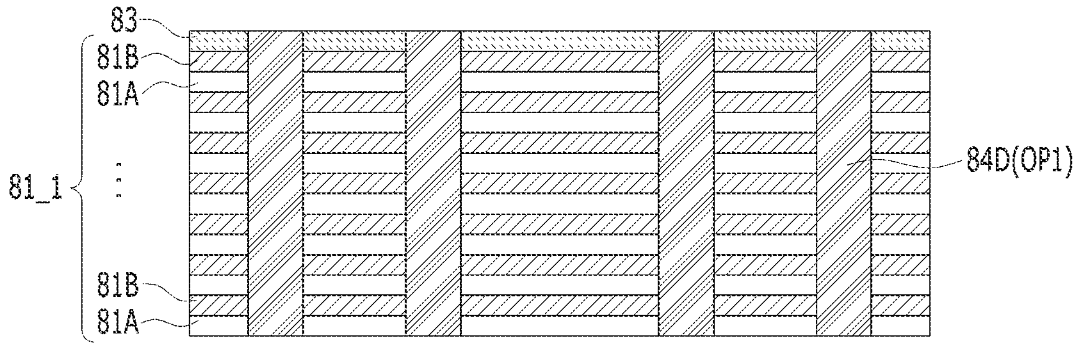

Referring to FIGS. 11, 12A, and 12B, a first stack 71_1 including first material layers 71A and second material layers 71B that are alternately stacked may be formed in the scribe lane area 70 that is disposed between the chip areas 80 of the substrate 100. Subsequently, a first mask layer 73 may be formed on the first stack 71_1.

Subsequently, alignment keys 72 may be formed within the first mask layer 73 and the first stack 71_1. First, third openings OP3 may be formed within the first mask layer 73 and the first stack 71_1. Subsequently, the alignment keys 72 may be formed within the third openings OP3, respectively.

When the first stack 71_1 is formed, a first cell stack 81_1 may be formed in the chip areas 80. The first cell stack 81_1 may include first material layers 81A and second material layers 81B that are alternately stacked. Subsequently, when the first mask layer 73 is formed on the first stack 71_1, a first mask layer 83 may be formed on the first cell stack 81_1.

Subsequently, when the alignment keys 72 are formed, sacrificial layers 84D may be formed within the first cell stack 81_1. First, first openings OP1 may be formed within the first mask layer 83 and the first cell stack 81_1. Subsequently, the sacrificial layers 84D may be formed within the first openings OP1, respectively. In this case, the first openings OP1 may be formed together with the third openings OP3.

Figure 13A:
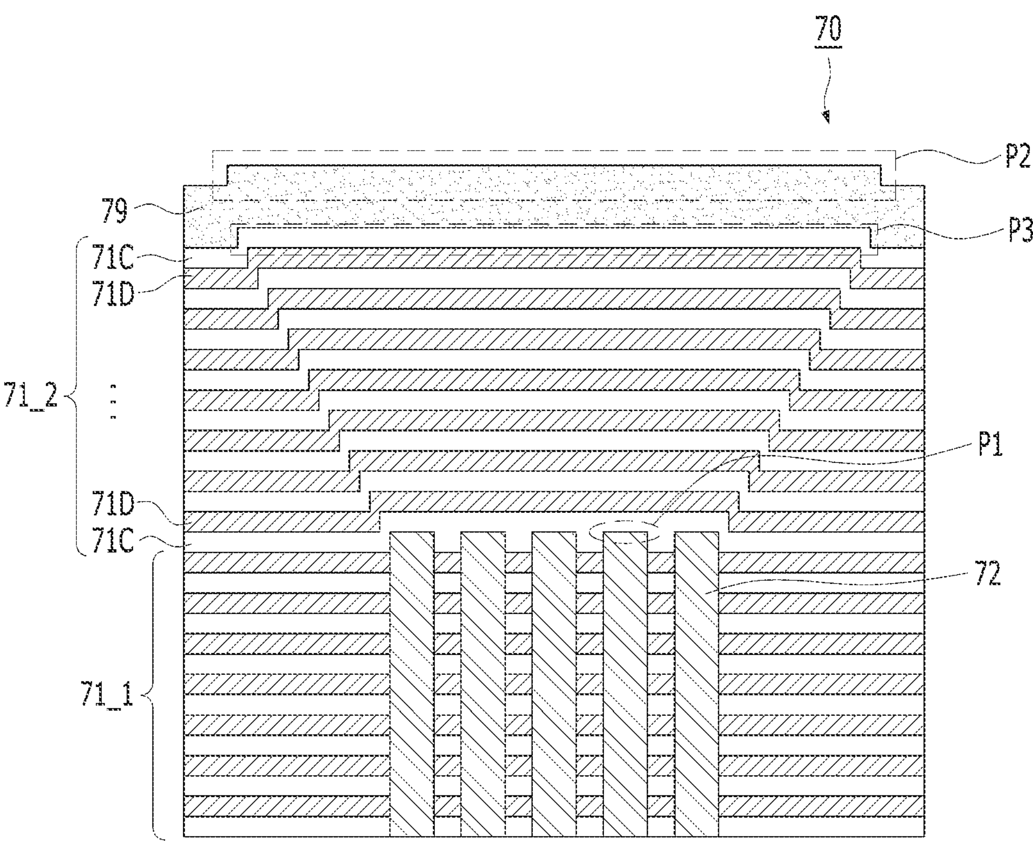
Figure 13B:
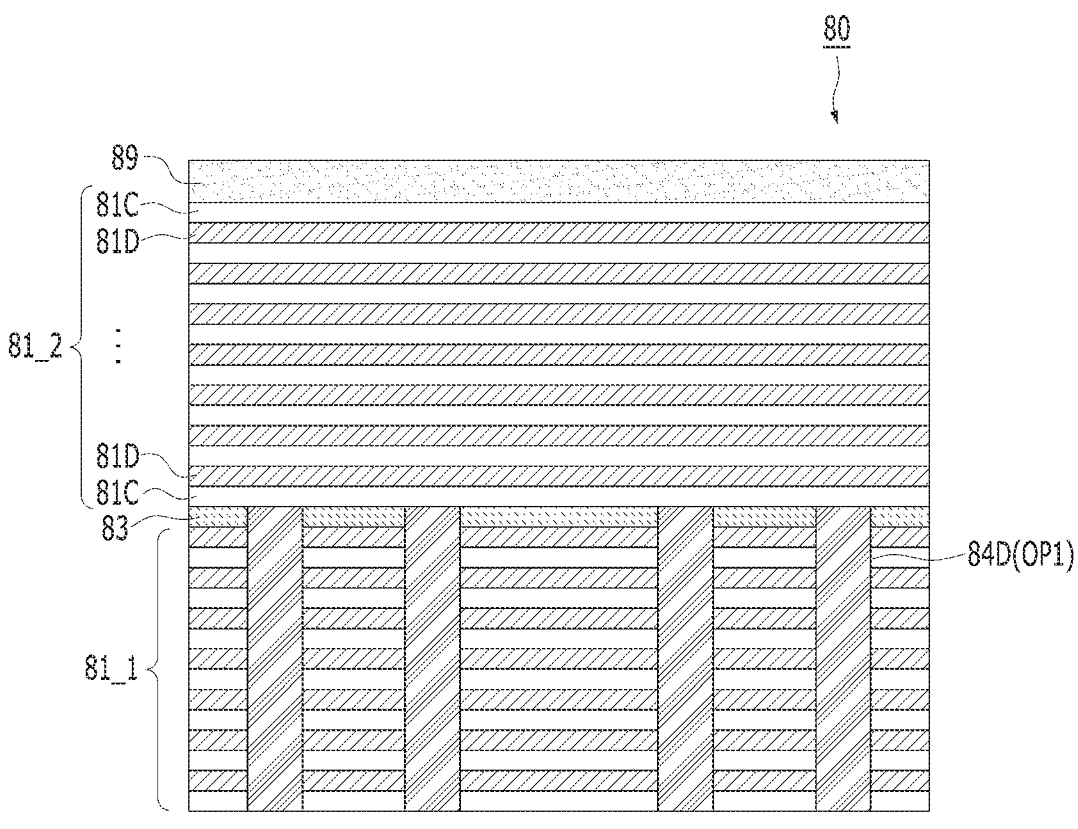

Referring to FIGS. 11, 13A, and 13B, in the scribe lane area 70, the first mask layer 73 may be etched so that the alignment keys 72 protrude from the upper surface of the first stack 71_1. The protruded part of the alignment keys 72 may be defined as a first protrusion part P1. When the first mask layer 73 is etched, the first mask layer 83 of the chip areas 80 may remain.

Subsequently, a second stack 71_2 may be formed on the first stack 71_1. The second stack 71_2 may include third material layers 71C and fourth material layers 71D that are alternately stacked. The second stack 71_2 may include a protrusion part that is disposed in accordance with the alignment keys 72. The protrusion part of the second stack 71_2 may be defined as a third protrusion part P3. The second stack 71_2 may include at least one third protrusion part P3. For example, the third protrusion part P3 may correspond to the first protrusion part P1 in a one-to-one way or a one-to-many way.

Subsequently, a second mask layer 79 may be formed on the second stack 71_2. The second mask layer 79 may include a protrusion part that is disposed in accordance with the third protrusion part P3. The protrusion part of the second mask layer 79 may be defined as a second protrusion part P2. The second protrusion part P2 may be disposed in accordance with the first protrusion part P1.

When the second stack 71_2 is formed, a second cell stack 81_2 may be formed in the chip areas 80. The second cell stack 81_2 may include third material layers 81C and fourth material layers 81D that are alternately stacked. Subsequently, when the second mask layer 79 is formed, a second mask layer 89 may be formed in the chip areas 80. The second mask layer 89 and the second cell stack 81_2 might not include a protrusion part, unlike the second mask layer 79 and the second stack 71_2. The reason for this is that the sacrificial layers 84D and the first cell stack 81_1 do not include a protrusion part that protrudes from the upper surface of the first cell stack 81_1.

Figure 14A:
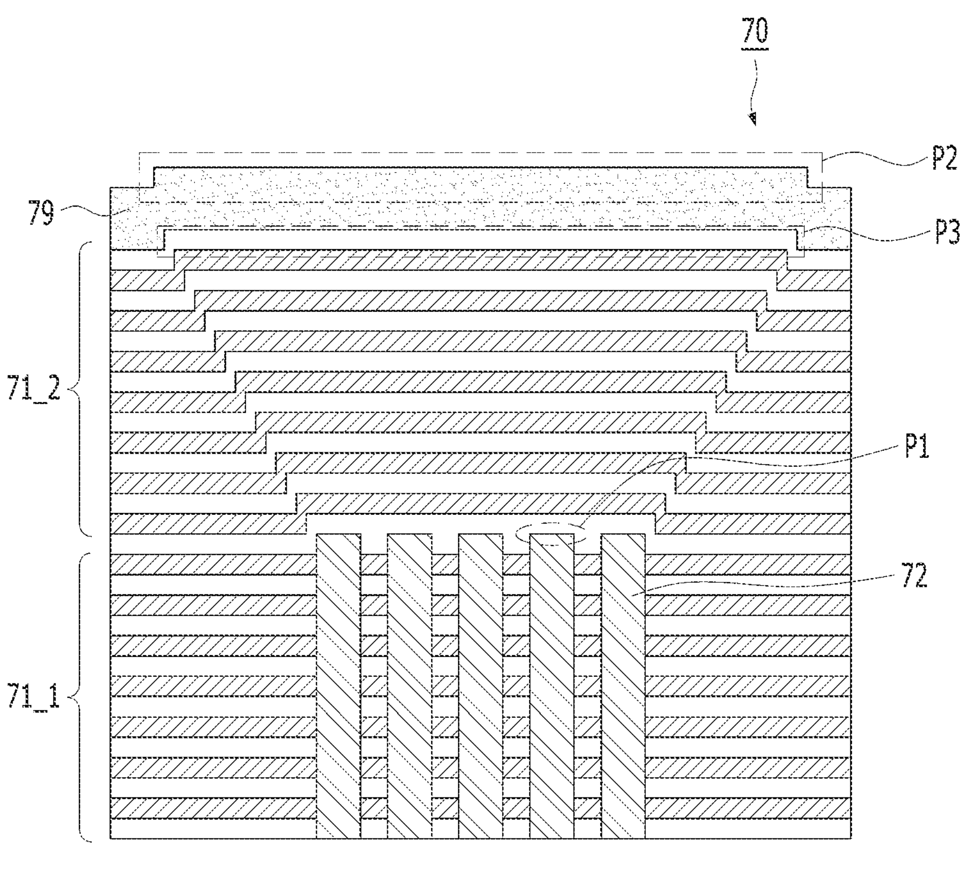
Figure 14B:
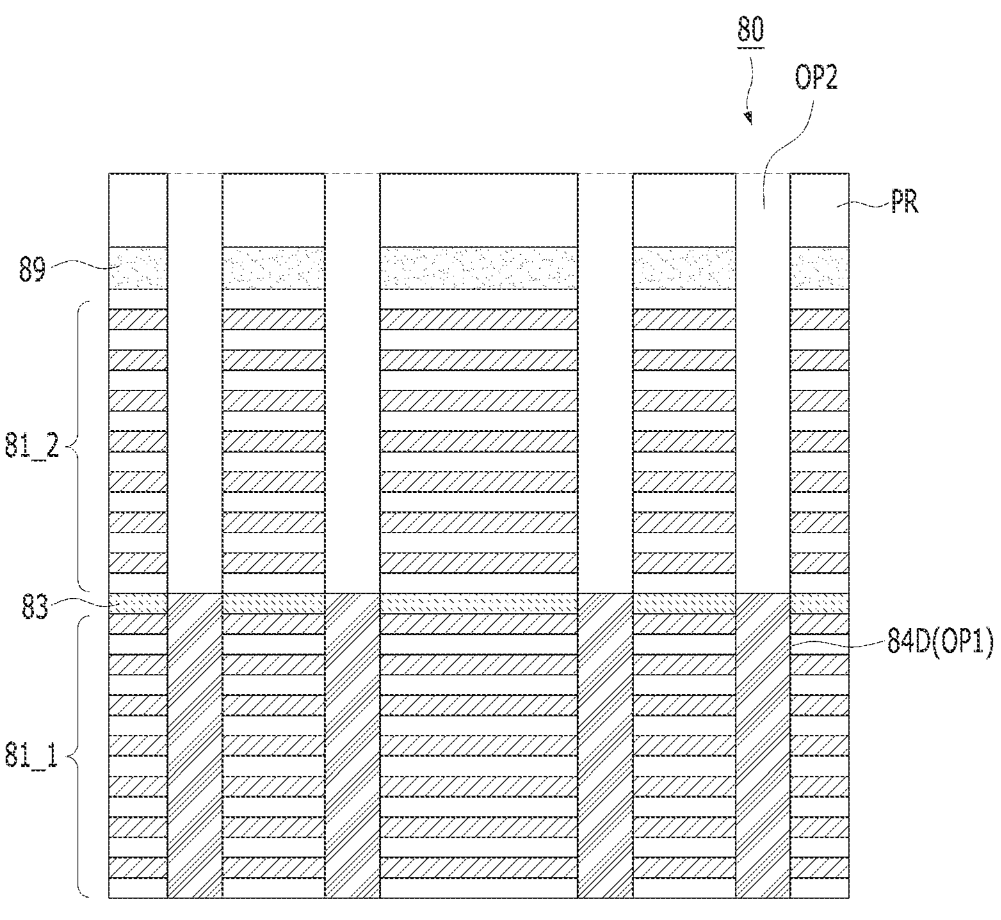

Referring to FIGS. 11, 14A, and 14B, second openings OP2 may be formed in the chip areas 80. First, a mask pattern PR may be aligned in the chip areas 80 through the second stack 71_2 including the third protrusion part P3 or the second mask layer 79 including the second protrusion part P2, which is formed by using the alignment keys 72 of the scribe lane area 70. For example, the location of the alignment keys 72 may be indirectly recognized by the third protrusion part P3 or the second protrusion part P2. The mask pattern PR may be aligned in the chip areas 80 based on the recognized location of the alignment keys 72. Subsequently, the second openings OP2 that are connected to the first openings OP1 may be formed by etching the second mask layer 89 and the second cell stack 81_2 by using the mask pattern PR as an etch barrier.

The second mask layer 79 of the scribe lane area 70 is for protecting the alignment keys 72 in a process of manufacturing the semiconductor device. For example, the second mask layer 79 can prevent the alignment keys 72 from being damaged by gas or a solution that is used when the second openings OP2 is formed in the chip areas 80 or can reduce damage to the alignment keys 72, which is attributable to the gas or solution.

Figure 15A:
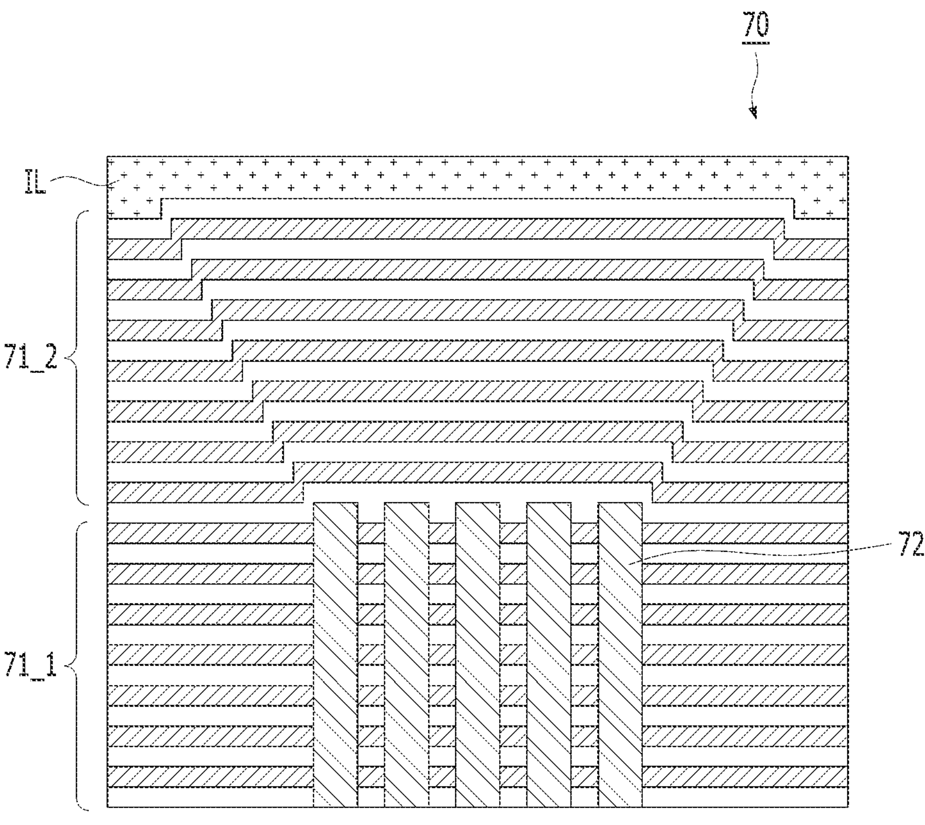
Figure 15B:
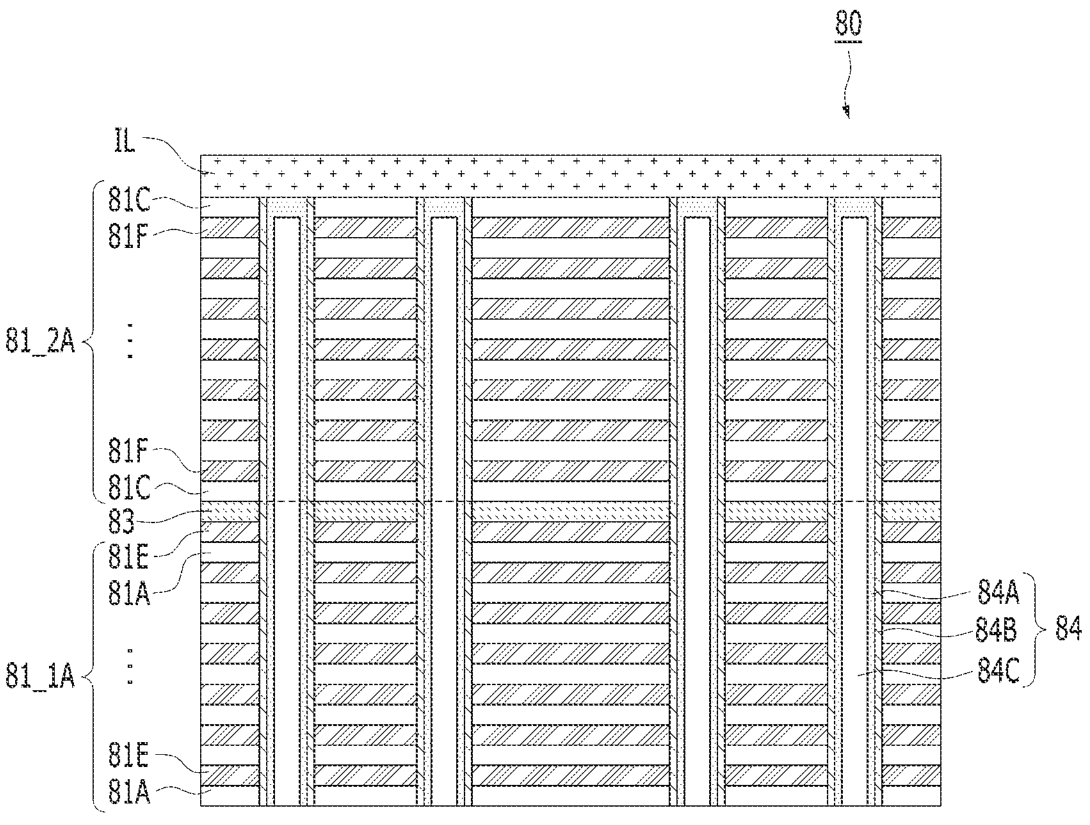

Referring to FIGS. 11, 15A, and 15B, an interlayer insulating layer IL may be formed in the scribe lane area 70. First, the second mask layer 79 may be removed. Subsequently, the interlayer insulating layer IL may be formed on the second stack 71_2.

Channel structures 84 may be formed in the chip areas 80. First, the sacrificial layers 84D may be removed through the second opening OP2. Subsequently, the channel structures 84 may be formed within the first openings OP1 and the second openings OP2, respectively. Each of the channel structures 84 may include at least one of a channel layer 84A, a memory layer 84B, and an insulating core 84C. For reference, the present disclosure is not limited to an example in which the channel structures 84 are formed within the second openings OP2. For example, at least one of isolation insulating layers, a source contact structure, supports, and a contact structure may be formed within the second openings OP2.

Subsequently, an interlayer insulating layer IL may be formed in the chip areas 80. When the interlayer insulating layer IL of the scribe lane area 70 is formed, the interlayer insulating layer IL of the chip areas 80 may be formed. Subsequently, the substrate 100 may be cut. For example, the substrate 100 may be cut along the scribe lane area 70. Accordingly, the substrate 100 may include the chip area 80 and an edge area that surrounds the chip area 80.

According to the aforementioned process, the alignment keys 72 including the first protrusion part P1 may be formed in the first stack 71_1, and the second stack 71_2 and the second mask layer 79 may be formed on the first stack 71_1. The second stack 71_2 and the second mask layer 79 may include the third protrusion part P3 and the second protrusion part P2, respectively, by the first protrusion part P1. The location of the alignment keys 72 may be indirectly recognized by the second protrusion part P2 and the third protrusion part P3.

Those of ordinary skill in the art should recognize that the embodiments disclosed and claimed herein, significantly improve semiconductor fabrication alignment, through which chip quality and yield can be significantly improved. Using the embodiments disclosed herein, it is possible to continuously-deposit layers that can be alternately deposited with oxides-nitrides, which form a mesa-shaped key structure.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor device comprising:

a substrate comprising a plurality of chip areas and a scribe lane area, wherein the scribe lane area is disposed between the chip areas;

a first stack disposed in the scribe lane area and comprising first material layers and second material layers that are alternately stacked; and alignment keys penetrating through the first stack and comprising first protrusion parts that protrude from an upper surface of the first stack, wherein the alignment keys comprise at least one structural body distinct from the first material layers and the second material layers.

2. The semiconductor device of claim 1, further comprising a second stack formed and located under the first stack, the second stack comprising third material layers and fourth material layers that are alternately stacked, the first and second stacks being joined together thereby forming a monolithic structure.

3. The semiconductor device of claim 1, further comprising a second stack formed and located over the first stack, the second stack comprising third material layers and fourth material layers that are alternately stacked, the second stack comprising a second protrusion part disposed in accordance with the first protrusion parts, the first and second stacks being joined together and forming a monolithic structure.

4. The semiconductor device of claim 1, further comprising:

a first gate structure disposed in the chip areas and comprising first conductive layers and first insulating layers that are disposed in the chip areas and that are alternately stacked; and channel structures disposed within the first gate structure and having a height substantially the same as a height of the alignment keys.

5. The semiconductor device of claim 4, wherein each of the channel structures comprises:

a channel layer; and a memory layer that surrounds the channel layer.

6. The semiconductor device of claim 5, wherein each of the alignment keys comprises:

a dummy channel layer; and a dummy memory layer that substantially surrounds the dummy channel layer.

7. The semiconductor device of claim 1, further comprising:

a first gate structure disposed in the chip areas and comprising first conductive layers and first insulating layers that are alternately stacked;

a second gate structure disposed under the first gate structure and comprising second conductive layers and second insulating layers that are alternately stacked; and channel structures disposed within the first gate structure and the second gate structure.

8. The semiconductor device of claim 1, wherein the alignment keys comprise:

a first group in which a first plurality of the alignment keys are arranged in a first direction, and a second group in which a second plurality of the alignment keys are arranged in a second direction that intersects the first direction.

9. The semiconductor device of claim 1, wherein the alignment key comprises an oxide or a nitride.

10. The semiconductor device of claim 1, wherein the alignment key comprises a metal material.

11. A semiconductor device comprising:

a substrate comprising a chip area and an edge area that surrounds the chip area;

a first stack disposed in the edge area and comprising first material layers and second material layers that are alternately stacked;

a second stack disposed below the first stack and comprising third material layers and fourth material layers that are alternately stacked;

a first gate structure corresponding to the first stack which is disposed in the chip area and comprising first conductive layers and first insulating layers that are alternately stacked;

a second gate disposed below the first gate structure and comprising second conductive layers and second insulating layers that are alternately stacked;

channel structures extending through the first gate structure and the second gate structure; and at least one alignment key disposed within the first stack and comprising a first protrusion part that protrudes from an upper surface of a top layer of the first stack and which extends at least part way into an interlayer insulating layer formed on the top layer of the first stack, wherein a lower surface of the alignment key is disposed at a level substantially the same as a lower surface of the first stack and an upper surface of the alignment key is disposed at a level substantially the same as an upper surface of the interlayer insulating layer, with the alignment key extending through the first stack in a direction perpendicular to the substrate.

12. The semiconductor device of claim 11, the alignment keys comprise:

a first group in which a first plurality of the alignment keys are arranged in a first direction, and a second group in which a second plurality of the alignment keys are arranged in a second direction that intersects the first direction, the first and second directions are orthogonal and their orientations are relative to a particular dimension of the alignment keys.

13. The semiconductor device of claim 11, wherein the alignment key comprises:

a dummy channel layer; and a dummy memory layer that substantially surrounds the dummy channel layer.

14. The semiconductor device of claim 11, wherein the alignment key comprises an oxide or a nitride.

15. The semiconductor device of claim 11, wherein the alignment key comprises a metal material.

16. A semiconductor device comprising:

a substrate comprising a chip area and an edge area that surrounds the chip area;

a first stack disposed in the edge area and comprising first material layers and second material layers that are alternately stacked;

a second stack disposed over the first stack and comprising third material layers and fourth material layers that are alternately stacked; and at least one alignment key disposed within the first stack and comprising a first protrusion part that protrudes from an upper surface of a top layer of the first stack in a stacking direction toward the second stack, wherein the alignment key comprises at least one structural body distinct from the first material layers and the second material layers, and the alignment key extends through the first stack in a direction perpendicular to the substrate.

17. The semiconductor device of claim 16, wherein the second stack comprising a second protrusion part disposed in accordance with the first protrusion parts.

18. The semiconductor device of claim 16, further comprising a first gate structure corresponding to the first stack which is disposed in the chip area and comprising first conductive layers and first insulating layers that are alternately stacked;

a second gate disposed over the first gate structure and comprising second conductive layers and second insulating layers that are alternately stacked; and channel structures extending through the first gate structure and the second gate structure.

19. The semiconductor device of claim 16, wherein alignment keys comprise:

a first group in which a first plurality of the alignment keys are arranged in a first direction, and a second group in which a second plurality of the alignment keys are arranged in a second direction that intersects the first direction, the first and second directions are orthogonal and their orientations are relative to a particular dimension of the alignment keys.

20. The semiconductor device of claim 16, wherein the alignment key comprises a metal material.

* * * * *